US012615066B2

(12) United States Patent
Boos et al.

(10) Patent No.: US 12,615,066 B2
(45) Date of Patent: Apr. 28, 2026

(54) ELECTRONIC DEVICES WITH POWER BOOSTING FOR HIGH FREQUENCY COMMUNICATION

(71) Applicant: Apple Inc., Cupertino, CA (US)

(72) Inventors: Zdravko Boos, Munich (DE); Bertram R Gunzelmann, Koenigsbrunn (DE); Nedim Muharemovic, Nuremberg (DE); Ramin Khayatzadeh, Munich (DE)

(73) Assignee: Apple Inc., Cupertino, CA (US)

( * ) Notice: Subject to any disclaimer, the term of this patent is extended or adjusted under 35 U.S.C. 154(b) by 413 days.

(21) Appl. No.: 18/184,555

(22) Filed: Mar. 15, 2023

(65) Prior Publication Data

US 2023/0327690 A1     Oct. 12, 2023

Related U.S. Application Data

(60) Provisional application No. 63/328,561, filed on Apr. 7, 2022.

(51) Int. Cl.
H04B 1/04        (2006.01)
H03F 1/56        (2006.01)
(Continued)

(52) U.S. Cl.
CPC ........... H04B 1/0458 (2013.01); H03F 1/565 (2013.01); H03F 3/195 (2013.01); H04B 1/18 (2013.01); H03F 2200/451 (2013.01)

(58) Field of Classification Search
CPC ...... H04B 1/0458; H04B 1/18; H04B 1/0483; H04B 2001/045; H04B 2210/006;
(Continued)

(56) References Cited

U.S. PATENT DOCUMENTS 4,663,596 A * 5/1987 Heeks ................... H04B 10/29
                                                     398/197
2004/0213587 A1* 10/2004 Conchas ............ H04B 10/1123
                                                     398/212
(Continued)

FOREIGN PATENT DOCUMENTS

CN        101188754 A      5/2008
CN        101197624 B  *  3/2011
(Continued)

OTHER PUBLICATIONS

U.S. Appl. No. 17/892,849, filed Aug. 22, 2022.
(Continued)

*Primary Examiner* — Lana N Le
(74) *Attorney, Agent, or Firm* — Treyz Law Group, P.C.; Michael H. Lyons

(57) ABSTRACT

An electronic device may include wireless circuitry with light sources, a set of photodiodes, a resonating element, and a common gate amplifier (CGA). In a transmit mode, the photodiodes may use optical local oscillators to generate equal portions of an antenna current amplified by the CGA for transmission by the resonating element. In a receive mode, the resonating element may generate an antenna current which is amplified by the amplifier and passed to the photodiodes. Including multiple photodiodes coupled to the amplifier in a current sharing configuration may serve to boost power. The amplifier may exhibit a wide bandwidth, may perform impedance matching between the resonating element and the photodiodes, and may isolate the photodiodes from antenna mismatch. The antenna may be integrated into a phased antenna array to further boost power.

19 Claims, 10 Drawing Sheets

(51) Int. Cl.
  *H03F 3/195*       (2006.01)
  *H04B 1/18*        (2006.01)

(58) Field of Classification Search
  CPC .... H04B 1/44; H04B 10/2575; H04B 10/116;
       H04B 7/0617; H04B 10/502; H04B
       10/25759; H04B 10/11; H04B 10/516;
       H04B 10/25752; H04B 1/40; H04B
       10/67; H04B 10/69; H04B 10/2581;
       H04B 7/0628; H04B 1/16; H04B 7/08;
       H04B 1/401; H04B 1/48; H04B 10/6911;
       H04B 10/503; H04B 10/25891; H04B
       10/40; H04B 10/1127; H03F 1/565; H03F
       3/195; H03F 2200/451; H03F 3/082;
       H01Q 3/2676; H01Q 3/36; H01Q 3/30;
       H01Q 9/0485; H01Q 1/2283; H01Q 1/24;
       H01Q 3/22; G02B 27/0101; G02B 6/0043
  See application file for complete search history.

(56)               References Cited

U.S. PATENT DOCUMENTS

| | | | |
|---|---|---|---|
| 2005/0259908 A1* | 11/2005 | Donati | H03C 7/025 |
| 2008/0056734 A1 | 3/2008 | Rofougaran | |
| 2009/0225330 A1* | 9/2009 | Chow | G01S 7/481 |
| 2014/0022119 A1* | 1/2014 | Lohr | H04B 10/2575 |
| 2015/0145597 A1* | 5/2015 | Huang | H03F 3/087 |
| | | | 330/260 |
| 2018/0039153 A1* | 2/2018 | Hashemi | G02F 1/2955 |
| 2019/0154932 A1* | 5/2019 | Shi | H04B 10/70 |
| 2020/0112384 A1* | 4/2020 | Yu | H04B 7/0413 |
| 2020/0137468 A1* | 4/2020 | Schimpe | H04B 10/61 |
| 2020/0328573 A1* | 10/2020 | Prather | H04B 2210/006 |
| 2021/0152251 A1* | 5/2021 | Moon | H04B 10/506 |
| 2022/0021114 A1* | 1/2022 | Gal | H03F 3/195 |
| 2023/0057449 A1 | 2/2023 | Boos et al. | |
| 2023/0058998 A1 | 2/2023 | Gunzelmann et al. | |

FOREIGN PATENT DOCUMENTS

| | | | | |
|---|---|---|---|---|
| DE | 0637405 A1 * | 7/1997 | | |
| FR | 2760925 A1 * | 9/1998 | .............. | H04B 1/48 |
| KR | 0160118555 A * | 10/2016 | | |

OTHER PUBLICATIONS

Yuki Matsuo et al., THz-Wave Power Multiplication by Parallel-Connection UTC-PDs, 2020 Opto-Electronics and Communications Conference (OECC), Oct. 4-8, 2020, IEEE, New York, NY, United States.

James P. Seddon et al., Photodiodes for Terahertz Applications, IEEE Journal of Selected Topics in Quantum Electronics, Mar./Apr. 2022, vol. 28, No. 2, IEEE, New York, NY, United States.

Thomas W. Crowe et al., Opening the Terahertz Window With Integrated Diode Circuits, IEEE Journal of Solid-State Circuits, Oct. 2005, pp. 2104-2110, vol. 40, No. 10, IEEE, New York, NY, United States.

Shoichi Shiba et al., F-band Bidirectional Amplifier using 75-nm InP HEMTs, 2012 IEEE Compound Semiconductor Integrated Circuit Symposium (CSICS), Oct. 14-17, 2012, IEEE, New York, NY, United States.

Tetsuo Sasaki et al., Continuous Wave Terahertz Signal Generator based on Difference Frequency Generation in Gallium Phosphide Crystal and its Applications for Spectroscopy, Proceedings of the 11th IEEE Annual International Conference on Nano/Micro Engineered and Molecular Systems (NEMS) Matsushima Bay and Sendai MEMS City, Japan, Apr. 17-20, 2016, IEEE, New York, NY, United States.

Nagatsuma Tadao et al., High-Power RF Uni-Traveling-Carrier Photodiodes (UTC-PDs) and Their Applications, Advances in Photodiodes, Mar. 2011, pp. 291-314, InTech.

Jalali Mohsen et al., Gm-boosted differential transimpedance amplifier architecture, IEICE Electronics Express, Aug. 2007, pp. 498-503, vol. 4, No. 16, IEICE.

* cited by examiner

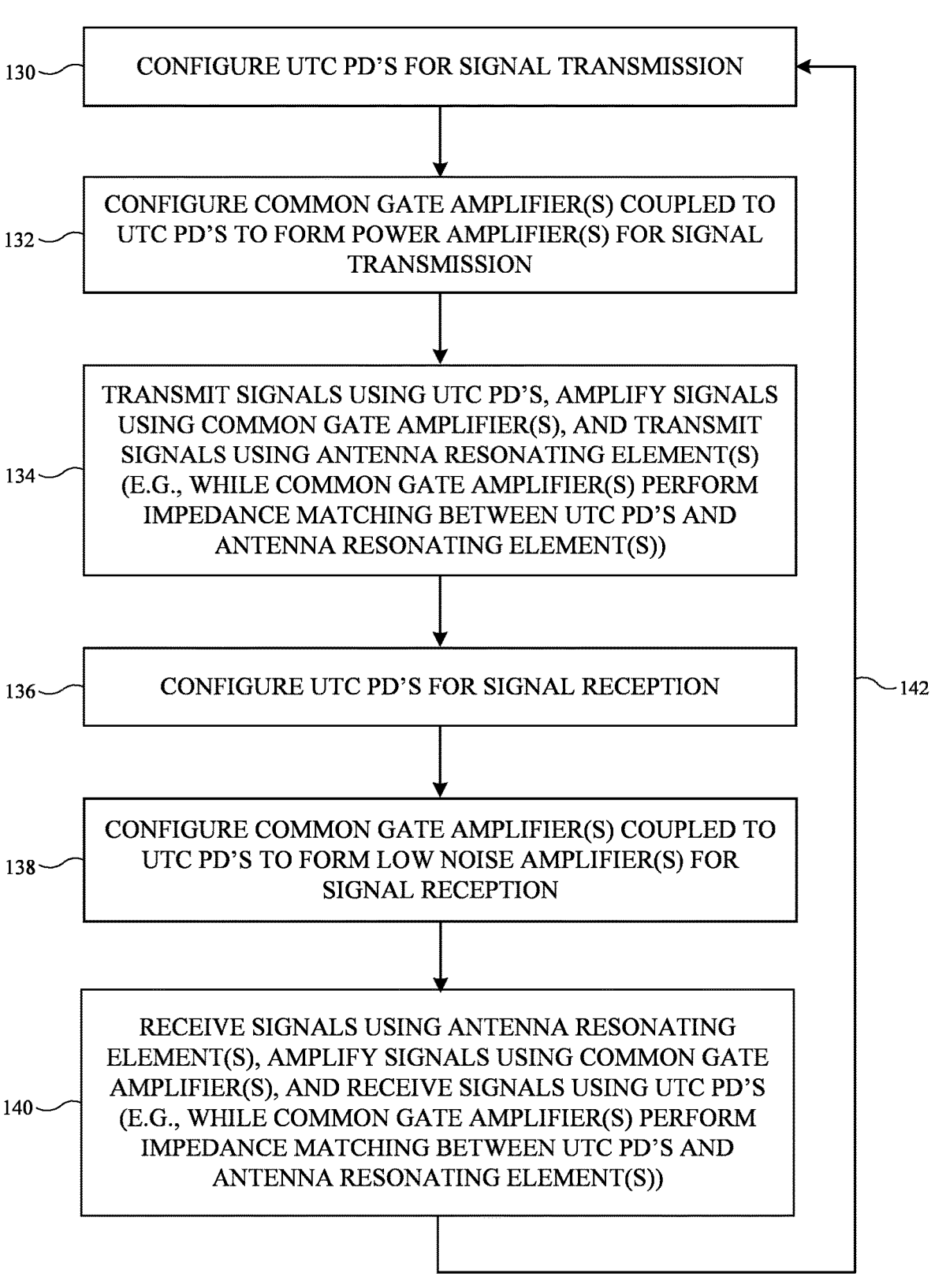

130 — CONFIGURE UTC PD'S FOR SIGNAL TRANSMISSION

132 — CONFIGURE COMMON GATE AMPLIFIER(S) COUPLED TO UTC PD'S TO FORM POWER AMPLIFIER(S) FOR SIGNAL TRANSMISSION

134 — TRANSMIT SIGNALS USING UTC PD'S, AMPLIFY SIGNALS USING COMMON GATE AMPLIFIER(S), AND TRANSMIT SIGNALS USING ANTENNA RESONATING ELEMENT(S) (E.G., WHILE COMMON GATE AMPLIFIER(S) PERFORM IMPEDANCE MATCHING BETWEEN UTC PD'S AND ANTENNA RESONATING ELEMENT(S))

136 — CONFIGURE UTC PD'S FOR SIGNAL RECEPTION

138 — CONFIGURE COMMON GATE AMPLIFIER(S) COUPLED TO UTC PD'S TO FORM LOW NOISE AMPLIFIER(S) FOR SIGNAL RECEPTION

140 — RECEIVE SIGNALS USING ANTENNA RESONATING ELEMENT(S), AMPLIFY SIGNALS USING COMMON GATE AMPLIFIER(S), AND RECEIVE SIGNALS USING UTC PD'S (E.G., WHILE COMMON GATE AMPLIFIER(S) PERFORM IMPEDANCE MATCHING BETWEEN UTC PD'S AND ANTENNA RESONATING ELEMENT(S))

ELECTRONIC DEVICES WITH POWER BOOSTING FOR HIGH FREQUENCY COMMUNICATION

This application claims the benefit of U.S. Provisional Patent Application No. 63/328,561, filed Apr. 7, 2022, which is hereby incorporated by reference herein in its entirety.

FIELD

This disclosure relates generally to electronic devices and, more particularly, to electronic devices with wireless circuitry.

BACKGROUND

Electronic devices are often provided with wireless capabilities. An electronic device with wireless capabilities has wireless circuitry that includes one or more antennas. The wireless circuitry is used to perform communications using radio-frequency signals conveyed by the antennas.

As software applications on electronic devices become more data-intensive over time, demand has grown for electronic devices that support wireless communications at higher data rates. However, the maximum data rate supported by electronic devices is limited by the frequency of the radio-frequency signals. In addition, it can be difficult to provide wireless circuitry that supports these frequencies with satisfactory levels of wireless performance.

SUMMARY

An electronic device may include wireless circuitry with light sources that generate at least a first optical local oscillator (LO) signal and a second optical LO signal. The first optical LO signal may be provided with a phase shift. The second optical LO signal may be modulated with wireless data. The wireless circuitry may include an antenna having a set of photodiodes, an antenna resonating element coupled to the set of photodiodes by a signal path, and a common gate amplifier disposed on the signal path between the set of photodiodes and the antenna resonating element. The photodiodes and the common gate amplifier may be operated in a transmit mode, in a receive mode, or may be switched between transmit and receive modes.

In the transmit mode, the photodiodes may generate equal portions of an antenna current on the signal path. The common gate amplifier may amplify the antenna current as a power amplifier. The antenna resonating element may transmit wireless signals corresponding to the amplified antenna current. In the receive mode, the antenna resonating element may generate an antenna current based on received wireless signals. The common gate amplifier may amplify the antenna current as a low noise amplifier. The photodiodes may receive the antenna current and may convert the antenna current to intermediate frequencies signals or optical signals. Including multiple photodiodes coupled to a common gate amplifier in a current sharing configuration may serve to significantly boost the power of the antenna. The common gate amplifier may exhibit a wide bandwidth, may perform impedance matching between the antenna resonating element and the photodiodes, and may isolate the photodiodes from antenna mismatch. The antenna may be integrated into a phased antenna array to further boost power.

An aspect of the disclosure provides an electronic device. The electronic device can include an antenna resonating element. The electronic device can include a signal path coupled to the antenna resonating element. The electronic device can include a photodiode coupled to the signal path and configured to receive a first optical local oscillator (LO) signal and a second optical LO signal at a different frequency than the first optical LO signal. The electronic device can include a common gate amplifier disposed on the signal path between the photodiode and the antenna resonating element.

An aspect of the disclosure provides an electronic device. The electronic device can include a set of photodiodes. The electronic device can include an antenna resonating element. The electronic device can include a common gate amplifier coupled between the antenna resonating element and the set of photodiodes, wherein the common gate amplifier is switchable between a transmit mode and in a receive mode. The common gate amplifier can be configured to amplify a first current produced by the set of photodiodes for transmission using the antenna resonating element when in the transmit mode. The common gate amplifier can be configured to amplify a second current produced by the antenna resonating element for reception using the set of photodiodes when in the receive mode.

An aspect of the disclosure provides an electronic device. The electronic device can include a phased antenna array having at least a first antenna resonating element and a second antenna resonating element. The electronic device can include a first photodiode configured to generate a first portion of a first antenna current based on a first optical local oscillator (LO) signal provided with a first phase shift and based on a second optical LO signal modulated with wireless data. The electronic device can include a second photodiode configured to generate a second portion of the first antenna current based on the first optical LO signal provided with the first phase shift and based on the second optical LO signal modulated with the wireless data. The electronic device can include a first amplifier configured to amplify the first antenna current, the first antenna resonating element being configured to transmit first wireless signals corresponding to the first antenna current amplified by the first amplifier.

BRIEF DESCRIPTION OF THE DRAWINGS

FIG. 11 is a flow chart of illustrative operations involved in transmitting and receiving signals at frequencies greater than about 100 GHz using antennas of the types shown in FIGS. 8 and 9 in accordance with some embodiments.

DETAILED DESCRIPTION

Figure 1:
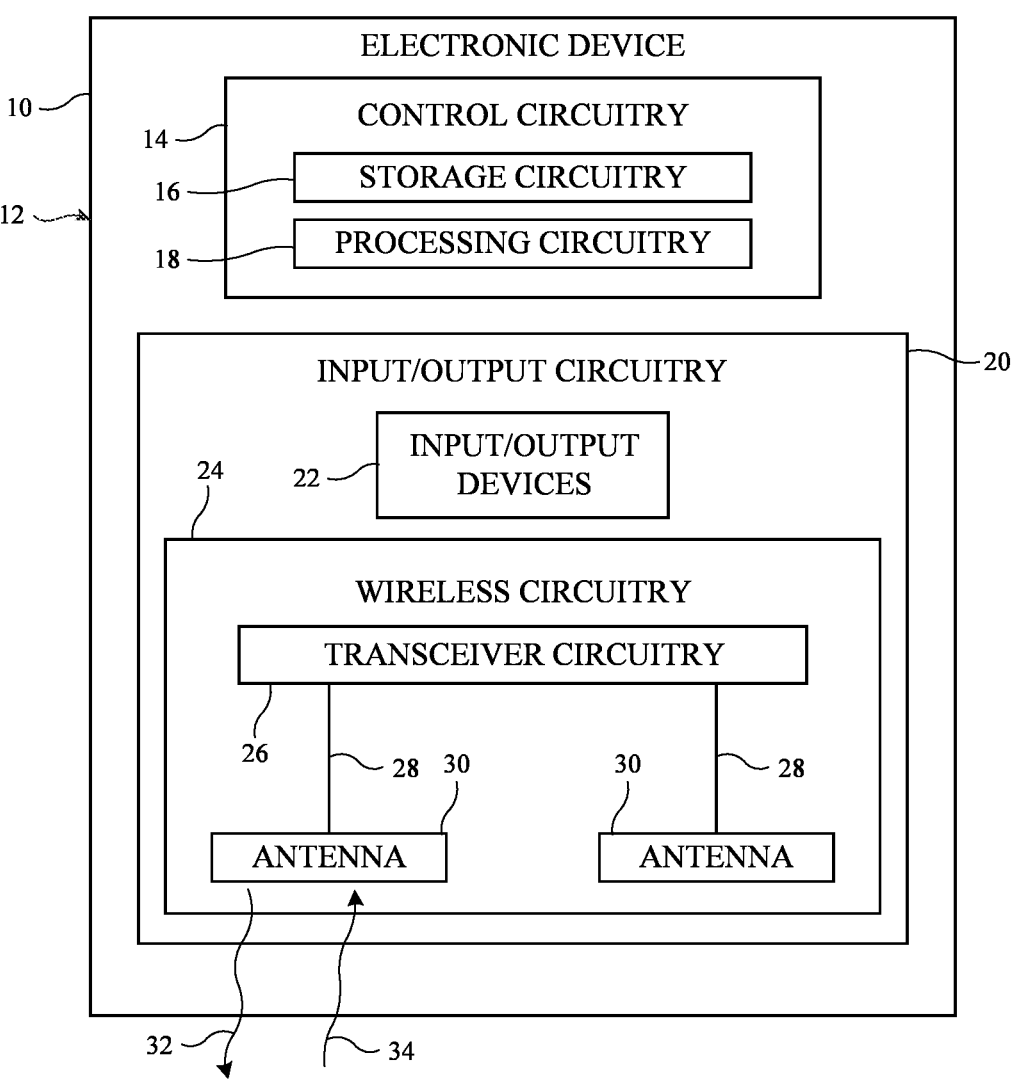
FIG. 1 is a block diagram of an illustrative electronic device having wireless circuitry with at least one antenna that conveys wireless signals at frequencies greater than about 100 GHz in accordance with some embodiments.

Electronic device 10 of FIG. 1 (sometimes referred to herein as electro-optical device 10) may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses, goggles, or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, part or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more processors, microprocessors, microcontrollers, digital signal processors, host processors, baseband processor integrated circuits, application specific integrated circuits, central processing units (CPUs), graphics processing units (GPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 3GPP Fifth Generation (5G) New Radio (NR) protocols, Sixth Generation (6G) protocols, sub-THz protocols, THz protocols, etc.), antenna diversity protocols, satellite navigation system protocols (e.g., global positioning system (GPS) protocols, global navigation satellite system (GLONASS) protocols, etc.), antenna-based spatial ranging protocols, optical communications protocols, or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), temperature sensors, etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas 30. Wireless circuitry 24 may also include transceiver circuitry 26. Transceiver circuitry 26 may include transmitter circuitry, receiver circuitry, modulator circuitry, demodulator circuitry (e.g., one or more modems), radio-frequency circuitry, one or more radios, intermediate frequency circuitry, optical transmitter circuitry, optical receiver circuitry, optical light sources, other optical components, baseband circuitry (e.g., one or more baseband processors), amplifier circuitry, clocking circuitry such as one or more local oscillators and/or phase-locked loops, memory, one or more registers, filter circuitry, switching circuitry, analog-to-digital converter (ADC) circuitry, digital-to-analog converter (DAC) circuitry, radio-frequency transmission lines, optical fibers, and/or any other circuitry for transmitting and/or receiving wireless signals using antennas 30. The components of transceiver circuitry 26 may be implemented on one integrated circuit, chip, system-on-chip (SOC), die, printed circuit board, substrate, or package, or the components of transceiver circuitry 26 may be distributed across two or more integrated circuits, chips, SOCs, printed circuit boards, substrates, and/or packages.

The example of FIG. 1 is merely illustrative. While control circuitry 14 is shown separately from wireless circuitry 24 in the example of FIG. 1 for the sake of clarity, wireless circuitry 24 may include processing circuitry (e.g., one or more processors) that forms a part of processing circuitry 18 and/or storage circuitry that forms a part of storage circuitry 16 of control circuitry 14 (e.g., portions of control circuitry 14 may be implemented on wireless circuitry 24). As an example, control circuitry 14 may include baseband circuitry (e.g., one or more baseband processors), digital control circuitry, analog control circuitry, and/or other control circuitry that forms part of wireless circuitry 24. The baseband circuitry may, for example, access a communication protocol stack on control circuitry 14 (e.g., storage circuitry 20) to: perform user plane functions at a PHY layer, MAC layer, RLC layer, PDCP layer, SDAP layer, and/or PDU layer, and/or to perform control plane functions at the PHY layer, MAC layer, RLC layer, PDCP layer, RRC, layer, and/or non-access stratum layer.

Transceiver circuitry 26 may be coupled to each antenna 30 in wireless circuitry 24 over a respective signal path 28. Each signal path 28 may include one or more radio-frequency transmission lines, waveguides, optical fibers, and/or any other desired lines/paths for conveying wireless signals between transceiver circuitry 26 and antenna 30. Antennas 30 may be formed using any desired antenna structures for conveying wireless signals. For example, antennas 30 may include antennas with resonating elements that are formed from dipole antenna structures, planar dipole antenna structures (e.g., bowtie antenna structures), slot antenna structures, loop antenna structures, patch antenna structures, inverted-F antenna structures, planar inverted-F antenna structures, helical antenna structures, monopole antennas, dipoles, hybrids of these designs, etc. Filter circuitry, switching circuitry, impedance matching circuitry, and/or other antenna tuning components may be adjusted to adjust the frequency response and wireless performance of antennas 30 over time.

If desired, two or more of antennas 30 may be integrated into a phased antenna array (sometimes referred to herein as a phased array antenna) in which each of the antennas conveys wireless signals with a respective phase and magnitude that is adjusted over time so the wireless signals constructively and destructively interfere to produce (form) a signal beam in a given pointing direction. The term "convey wireless signals" as used herein means the transmission and/or reception of the wireless signals (e.g., for performing unidirectional and/or bidirectional wireless communications with external wireless communications equipment). Antennas 30 may transmit the wireless signals by radiating the signals into free space (or to free space through intervening device structures such as a dielectric cover layer). Antennas 30 may additionally or alternatively receive the wireless signals from free space (e.g., through intervening devices structures such as a dielectric cover layer). The transmission and reception of wireless signals by antennas 30 each involve the excitation or resonance of antenna currents on an antenna resonating (radiating) element in the antenna by the wireless signals within the frequency band(s) of operation of the antenna.

Transceiver circuitry 26 may use antenna(s) 30 to transmit and/or receive wireless signals that convey wireless communications data between device 10 and external wireless communications equipment (e.g., one or more other devices such as device 10, a wireless access point or base station, etc.). The wireless communications data may be conveyed bidirectionally or unidirectionally. The wireless communications data may, for example, include data that has been encoded into corresponding data packets such as wireless data associated with a telephone call, streaming media content, internet browsing, wireless data associated with software applications running on device 10, email messages, etc.

Additionally or alternatively, wireless circuitry 24 may use antenna(s) 30 to perform wireless sensing operations. The sensing operations may allow device 10 to detect (e.g., sense or identify) the presence, location, orientation, and/or velocity (motion) of objects external to device 10. Control circuitry 14 may use the detected presence, location, orientation, and/or velocity of the external objects to perform any desired device operations. As examples, control circuitry 14 may use the detected presence, location, orientation, and/or velocity of the external objects to identify a corresponding user input for one or more software applications running on device 10 such as a gesture input performed by the user's hand(s) or other body parts or performed by an external stylus, gaming controller, head-mounted device, or other peripheral devices or accessories, to determine when one or more antennas 30 needs to be disabled or provided with a reduced maximum transmit power level (e.g., for satisfying regulatory limits on radio-frequency exposure), to determine how to steer (form) a radio-frequency signal beam produced by antennas 30 for wireless circuitry 24 (e.g., in scenarios where antennas 30 include a phased array of antennas 30), to map or model the environment around device 10 (e.g., to produce a software model of the room where device 10 is located for use by an augmented reality application, gaming application, map application, home design application, engineering application, etc.), to detect the presence of obstacles in the vicinity of (e.g., around) device 10 or in the direction of motion of the user of device 10, etc.

Wireless circuitry 24 may transmit and/or receive wireless signals within corresponding frequency bands of the electromagnetic spectrum (sometimes referred to herein as communications bands or simply as "bands"). The frequency bands handled by communications circuitry 26 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-100 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Over time, software applications on electronic devices such as device 10 have become more and more data intensive. Wireless circuitry on the electronic devices therefore needs to support data transfer at higher and higher data rates. In general, the data rates supported by the wireless circuitry are proportional to the frequency of the wireless signals conveyed by the wireless circuitry (e.g., higher frequencies can support higher data rates than lower frequencies). Wireless circuitry 24 may convey centimeter and millimeter wave signals to support relatively high data rates (e.g., because centimeter and millimeter wave signals are at relatively high frequencies between around 10 GHz and 100 GHz). However, the data rates supported by centimeter and millimeter wave signals may still be insufficient to meet all the data transfer needs of device 10. To support even higher data rates such as data rates up to 5-10 Gbps or higher, wireless circuitry 24 may convey wireless signals at frequencies greater than about 100 GHz.

As shown in FIG. 1, wireless circuitry 24 may transmit wireless signals 32 and may receive wireless signals 34 at frequencies greater than around 100 GHz (e.g., greater than 70 GHz, 80 GHz, 90 GHz, 110 GHz, etc.). Wireless signals 32 and 34 may sometimes be referred to herein as tremendously high frequency (THF) signals 32 and 34, sub-THz signals 32 and 34, THz signals 32 and 34, or sub-millimeter wave signals 32 and 34. THF signals 32 and 34 may be at sub-THz or THz frequencies such as frequencies between 100 GHz and 1 THz, between 100 GHz and 10 THz, between 100 GHz and 2 THz, between 200 GHz and 1 THz, between 300 GHz and 1 THz, between 300 GHz and 2 THz, between 70 GHz and 2 THz, between 300 GHz and 10 THz, between 100 GHz and 800 GHz, between 200 GHz and 1.5 THz, etc. (e.g., within a sub-THz, THz, THF, or sub-millimeter frequency band such as a 6G frequency band). The high data rates supported by these frequencies may be leveraged by device 10 to perform cellular telephone voice and/or data communications (e.g., while supporting spatial multiplexing to provide further data bandwidth), to perform spatial ranging operations such as radar operations to detect the presence, location, and/or velocity of objects external to device 10, to perform automotive sensing (e.g., with enhanced security), to perform health/body monitoring on a user of device 10 or another person, to perform gas or chemical detection, to form a high data rate wireless connection between device 10 and another device or peripheral device (e.g., to form a high data rate connection between a display driver on device 10 and a display that displays ultra-high resolution video), to form a remote radio head (e.g., a flexible high data rate connection), to form a THF chip-to-chip connection within device 10 that supports high data rates (e.g., where one antenna 30 on a first chip in device 10 transmits THF signals 32 to another antenna 30 on a second chip in device 10), and/or to perform any other desired high data rate operations.

Space is at a premium within electronic devices such as device 10. In some scenarios, different antennas 30 are used to transmit THF signals 32 than are used to receive THF signals 34. However, handling transmission of THF signals 32 and reception of THF signals 34 using different antennas 30 can consume an excessive amount of space and other resources within device 10 because two antennas 30 and signal paths 28 would be required to handle both transmission and reception. To minimize space and resource consumption within device 10, the same antenna 30 and signal path 28 may be used to both transmit THF signals 32 and to receive THF signals 34. If desired, multiple antennas 30 in wireless circuitry 24 may transmit THF signals 32 and may receive THF signals 34. The antennas may be integrated into a phased antenna array that transmits THF signals 32 and that receives THF signals 34 within a corresponding signal beam oriented in a selected beam pointing direction.

It can be challenging to incorporate components into wireless circuitry 24 that support wireless communications at these high frequencies. If desired, transceiver circuitry 26 and signal paths 28 may include optical components that convey optical signals to support the transmission of THF signals 32 and the reception of THF signals 34 in a space and resource-efficient manner. The optical signals may be used in transmitting THF signals 32 at THF frequencies and in receiving THF signals 34 at THF frequencies.

Figure 2:
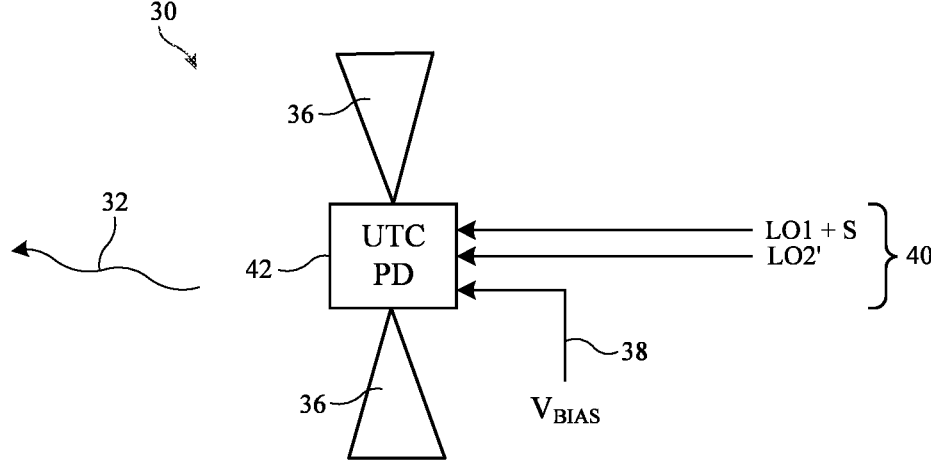
FIG. 2 is a top view of an illustrative antenna that transmits wireless signals at frequencies greater than about 100 GHz based on optical local oscillator (LO) signals in accordance with some embodiments.

FIG. 2 is a diagram of an illustrative antenna 30 that may be used to both transmit THF signals 32 and to receive THF signals 34 using optical signals. Antenna 30 may include one or more antenna radiating (resonating) elements 36 such as radiating (resonating) element arms. In the example of FIG. 2, antenna 30 is a planar dipole antenna (sometimes referred to as a "bowtie" antenna) having an antenna resonating element 36 with two opposing resonating element arms (e.g., bowtie arms or dipole arms). This is merely illustrative and, in general, antenna 30 may be any type of antenna having any desired antenna radiating element architecture.

As shown in FIG. 2, antenna 30 includes a photodiode (PD) 42 coupled between the arms of antenna resonating element 36. Electronic devices that include antennas 30 with photodiodes 42 such as device 10 may sometimes also be referred to as electro-optical devices (e.g., electro-optical device 10). Photodiode 42 may be a programmable photodiode. An example in which photodiode 42 is a programmable uni-travelling-carrier photodiode (UTC PD) is described herein as an example. Photodiode 42 may therefore sometimes be referred to herein as UTC PD 42 or programmable UTC PD 42. This is merely illustrative and, in general, photodiode 42 may include any desired type of adjustable/programmable photodiode or component that converts electromagnetic energy at optical frequencies to current at THF frequencies on antenna resonating element 36 and/or vice versa (e.g., a p-i-n diode, a tunneling diode, a TW UTC photodiode, other diodes with quadratic characteristics, an LT-GaAS photodiode, an M-UTC photodiode, etc.). Each radiating element arm in antenna resonating element 36 may, for example, have a first edge at UTC PD 42 and a second edge opposite the first edge that is wider than the first edge (e.g., in implementations where antenna 30 is a bowtie antenna). Other radiating elements may be used if desired.

UTC PD 42 may have a bias terminal (input) 38 that receives one or more control signals $V_{BIAS}$. Control signals $V_{BIAS}$ may include bias voltages provided at one or more voltage levels and/or other control signals for controlling the operation of UTC PD 42 such as impedance adjustment control signals for adjusting the output impedance of UTC PD 42. Control circuitry 14 (FIG. 1) may provide (e.g., apply, supply, assert, etc.) control signals $V_{BIAS}$ at different settings (e.g., values, magnitudes, etc.) to dynamically control (e.g., program or adjust) the operation of UTC PD 42 over time. For example, control signals $V_{BIAS}$ may be used to control whether antenna 30 transmits THF signals 32 or receives THF signals 34. When control signals $V_{BIAS}$ include a bias voltage asserted at a first level or magnitude, antenna 30 may be configured to transmit THF signals 32. When control signals $V_{BIAS}$ include a bias voltage asserted at a second level or magnitude, antenna 30 may be configured to receive THF signals 34. In the example of FIG. 2, control signals $V_{BIAS}$ include the bias voltage asserted at the first level to configure antenna 30 to transmit THF signals 32. If desired, control signals $V_{BIAS}$ may also be adjusted to control the waveform of the THF signals (e.g., as a squaring function that preserves the modulation of incident optical signals, a linear function, etc.), to perform gain control on the signals conveyed by antenna 30, and/or to adjust the output impedance of UTC PD 42.

As shown in FIG. 2, UTC PD 42 may be optically coupled to optical path 40. Optical path 40 may include one or more optical fibers or waveguides. UTC PD 42 may receive optical signals from transceiver circuitry 26 (FIG. 1) over optical path 40. The optical signals may include a first optical local oscillator (LO) signal LO1 and a second optical local oscillator signal LO2. Optical local oscillator signals LO1 and LO2 may be generated by light sources in transceiver circuitry 26 (FIG. 1). Optical local oscillator signals LO1 and LO2 may be at optical wavelengths (e.g., between 400 nm and 700 nm), ultra-violet wavelengths (e.g., near-ultra-violet or extreme ultraviolet wavelengths), and/or infrared wavelengths (e.g., near-infrared wavelengths, mid-infrared wavelengths, or far-infrared wavelengths). Optical local oscillator signal LO2 may be offset in wavelength from optical local oscillator signal LO1 by a wavelength offset X. Wavelength offset X may be equal to the wavelength of the THF signals conveyed by antenna 30 (e.g., between 100 GHz and 1 THz (1000 GHz), between 100 GHz and 2 THz, between 300 GHz and 800 GHz, between 300 GHz and 1 THz, between 300 and 400 GHz, etc.).

During signal transmission, wireless data (e.g., wireless data packets, symbols, frames, etc.) may be modulated onto optical local oscillator signal LO2 to produce modulated optical local oscillator signal LO2'. If desired, optical local oscillator signal LO1 may be provided with an optical phase shift S. Optical path 40 may illuminate UTC PD 42 with optical local oscillator signal LO1 (plus the optical phase shift S when applied) and modulated optical local oscillator signal LO2'. If desired, lenses or other optical components may be interposed between optical path 40 and UTC PD 42 to help focus the optical local oscillator signals onto UTC PD 42.

UTC PD 42 may convert optical local oscillator signal LO1 and modulated local oscillator signal LO2' (e.g., beats between the two optical local oscillator signals) into antenna currents that run along the perimeter of the radiating element arms in antenna resonating element 36. The frequency of the antenna current is equal to the frequency difference between local oscillator signal LO1 and modulated local oscillator signal LO2'. The antenna currents may radiate (transmit) THF signals 32 into free space. Control signal $V_{BIAS}$ may control UTC PD 42 to convert the optical local oscillator signals into antenna currents on the radiating element arms in antenna resonating element 36 while preserving the modulation and thus the wireless data on modulated local oscillator signal LO2' (e.g., by applying a squaring function to the signals). THF signals 32 will thereby carry the modulated wireless data for reception and demodulation by external wireless communications equipment.

Figure 3:
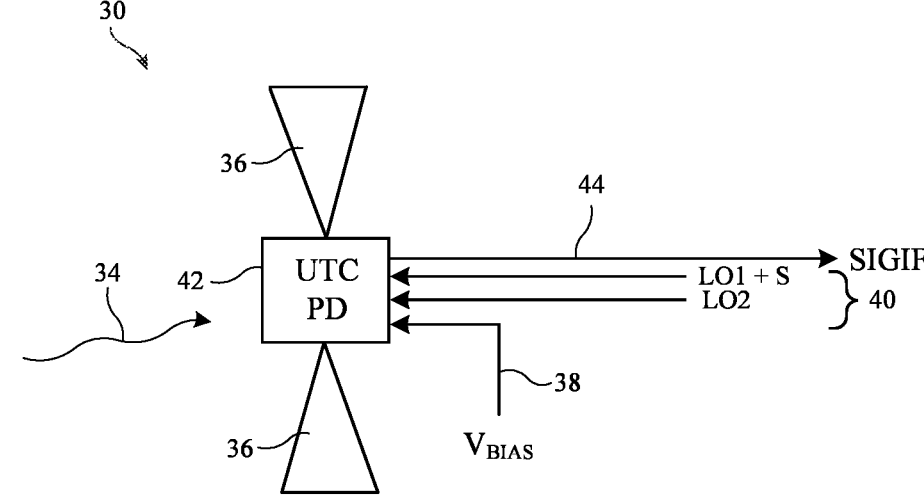
FIG. 3 is a top view showing how an illustrative antenna of the type shown in FIG. 2 may convert received wireless signals at frequencies greater than about 100 GHz into intermediate frequency signals based on optical LO signals in accordance with some embodiments.

FIG. 3 is a diagram showing how antenna 30 may receive THF signals 34 (e.g., after changing the setting of control signals $V_{BIAS}$ into a reception state from the transmission state of FIG. 2). As shown in FIG. 3, THF signals 34 may be incident upon the antenna radiating element arms of antenna resonating element 36. The incident THF signals 34 may produce antenna currents that flow around the perimeter of the radiating element arms in antenna resonating element 36. UTC PD 42 may use optical local oscillator signal LO1 (plus the optical phase shift S when applied), optical local oscillator signal LO2 (e.g., without modulation), and control signals $V_{BIAS}$ (e.g., a bias voltage asserted at the second level) to convert the received THF signals 34 into intermediate frequency signals SIGIF that are output onto intermediate frequency signal path 44.

The frequency of intermediate frequency signals SIGIF may be equal to the frequency of THF signals 34 minus the difference between the frequency of optical local oscillator signal LO1 and the frequency of optical local oscillator signal LO2. As an example, intermediate frequency signals SIGIF may be at lower frequencies than THF signals 32 and 34 such as centimeter or millimeter wave frequencies between 10 GHz and 100 GHz, between 30 GHz and 80 GHz, around 60 GHz, etc. If desired, transceiver circuitry 26 (FIG. 1) may change the frequency of optical local oscillator signal LO1 and/or optical local oscillator signal LO2 when switching from transmission to reception or vice versa. UTC PD 42 may preserve the data modulation of THF signals 34 in intermediate signals SIGIF. A receiver in transceiver circuitry 26 (FIG. 1) may demodulate intermediate frequency signals SIGIF (e.g., after further downconversion) to recover the wireless data from THF signals 34. In another example, wireless circuitry 24 may convert intermediate frequency signals SIGIF to the optical domain before recovering the wireless data. In yet another example, intermediate frequency signal path 44 may be omitted and UTC PD 42 may convert THF signals 34 into the optical domain for subsequent demodulation and data recovery (e.g., in a sideband of the optical signal).

Figure 4:
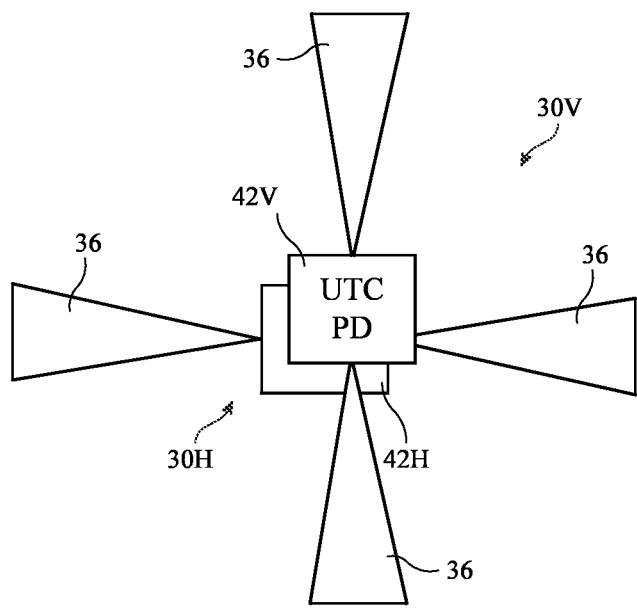
FIG. 4 is a top view showing how multiple antennas of the type shown in FIGS. 2 and 3 may be stacked to cover multiple polarizations in accordance with some embodiments.

The antenna 30 of FIGS. 2 and 3 may support transmission of THF signals 32 and reception of THF signals 34 with a given polarization (e.g., a linear polarization such as a vertical polarization). If desired, wireless circuitry 24 (FIG. 1) may include multiple antennas 30 for covering different polarizations. FIG. 4 is a diagram showing one example of how wireless circuitry 24 may include multiple antennas 30 for covering different polarizations.

As shown in FIG. 4, the wireless circuitry may include a first antenna 30 such as antenna 30V for covering a first polarization (e.g., a first linear polarization such as a vertical polarization) and may include a second antenna 30 such as antenna 30H for covering a second polarization different from or orthogonal to the first polarization (e.g., a second linear polarization such as a horizontal polarization). Antenna 30V may have a UTC PD 42 such as UTC PD 42V coupled between a corresponding pair of radiating element arms in antenna resonating element 36. Antenna 30H may have a UTC PD 42 such as UTC PD 42H coupled between a corresponding pair of radiating element arms in antenna resonating element 36 oriented non-parallel (e.g., orthogonal) to the radiating element arms in antenna resonating element 36 of antenna 30V. This may allow antennas 30V and 30H to transmit THF signals 32 with respective (orthogonal) polarizations and may allow antennas 30V and 30H to receive THF signals 32 with respective (orthogonal) polarizations.

To minimize space within device 10, antenna 30V may be vertically stacked over or under antenna 30H (e.g., where UTC PD 42V partially or completely overlaps UTC PD 42H). In this example, antennas 30V and 30H may both be formed on the same substrate such as a rigid or flexible printed circuit board. The substrate may include multiple stacked dielectric layers (e.g., layers of ceramic, epoxy, flexible printed circuit board material, rigid printed circuit board material, etc.). The antenna resonating element 36 in antenna 30V may be formed on a separate layer of the substrate than the antenna resonating element 36 in antenna 30H or the antenna resonating element 36 in antenna 30V may be formed on the same layer of the substrate as the antenna resonating element 36 in antenna 30H. UTC PD 42V may be formed on the same layer of the substrate as UTC PD 42H or UTC PD 42V may be formed on a separate layer of the substrate than UTC PD 42H. UTC PD 42V may be formed on the same layer of the substrate as the antenna resonating element 36 in antenna 30V or may be formed on a separate layer of the substrate as the antenna resonating element 36 in antenna 30V. UTC PD 42H may be formed on the same layer of the substrate as the antenna resonating element 36 in antenna 30H or may be formed on a separate layer of the substrate as the antenna resonating element 36 in antenna 30H.

Figure 5:
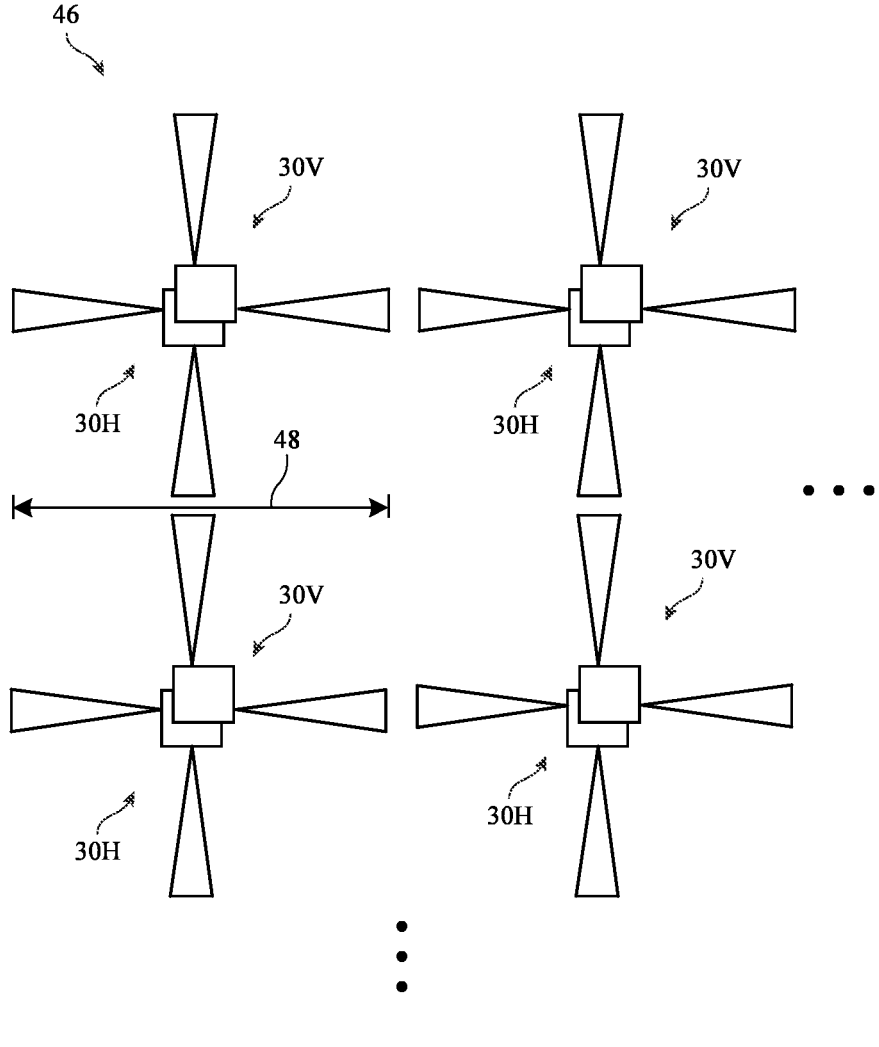
FIG. 5 is a top view showing how stacked antennas of the type shown in FIG. 4 may be integrated into a phased antenna array for conveying wireless signals at frequencies greater than about 100 GHz within a corresponding signal beam.

If desired, antennas 30 or antennas 30H and 30V of FIG. 4 may be integrated within a phased antenna array. FIG. 5 is a diagram showing one example of how antennas 30H and 30V may be integrated within a phased antenna array. As shown in FIG. 5, device 10 may include a phased antenna array 46 of stacked antennas 30H and 30V arranged in a rectangular grid of rows and columns. Each of the antennas in phased antenna array 46 may be formed on the same substrate. This is merely illustrative. In general, phased antenna array 46 (sometimes referred to as a phased array antenna) may include any desired number of antennas 30V and 30H (or non-stacked antennas 30) arranged in any desired pattern. Each of the antennas in phased antenna array 46 may be provided with a respective optical phase shift S (FIGS. 2 and 3) that configures the antennas to collectively transmit THF signals 32 and/or receive THF signals 34 that sum to form a signal beam of THF signals in a desired beam pointing direction. The beam pointing direction may be selected to point the signal beam towards external communications equipment, towards a desired external object, away from an external object, etc.

Phased antenna array 46 may occupy relatively little space within device 10. For example, each antenna 30V/30H may have a length 48 (e.g., as measured from the end of one radiating element arm to the opposing end of the opposite radiating element arm). Length 48 may be approximately equal to one-half the wavelength of THF signals 32 and 34. For example, length 48 may be as small as 0.5 mm or less. Each UTC-PD 42 in phased antenna array 46 may occupy a lateral area of 100 square microns or less. This may allow phased antenna array 46 to occupy very little area within device 10, thereby allowing the phased antenna array to be integrated within different portions of device 10 while still allowing other space for device components. The examples of FIGS. 2-5 are merely illustrative and, in general, each antenna may have any desired antenna radiating element architecture.

Figure 6:
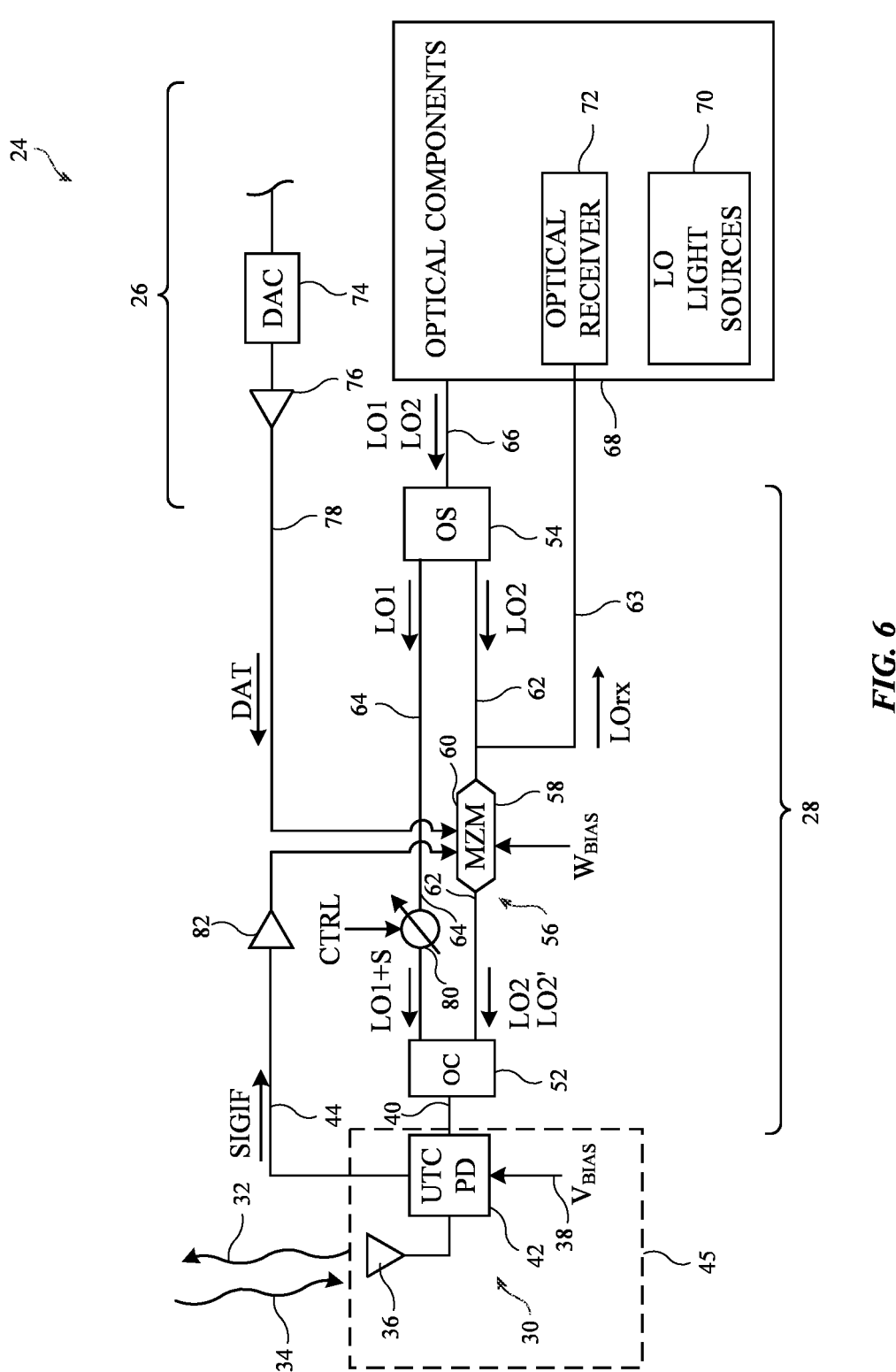
FIG. 6 is a circuit diagram of illustrative wireless circuitry having an antenna that transmits wireless signals at frequencies greater than about 100 GHz and that receives wireless signals at frequencies greater than about 100 GHz for conversion to intermediate frequencies and then to the optical domain in accordance with some embodiments.

FIG. 6 is a circuit diagram showing how a given antenna 30 and signal path 28 (FIG. 1) may be used to both transmit THF signals 32 and receive THF signals 34 based on optical local oscillator signals. In the example of FIG. 6, UTC PD 42 converts received THF signals 34 into intermediate frequency signals SIGIF that are then converted to the optical domain for recovering the wireless data from the received THF signals.

As shown in FIG. 6, wireless circuitry 24 may include transceiver circuitry 26 coupled to antenna 30 over signal path 28 (e.g., an optical signal path sometimes referred to herein as optical signal path 28). UTC PD 42 may be coupled between the radiating element arm(s) in antenna resonating element 36 of antenna 30 and signal path 28. Transceiver circuitry 26 may include optical components 68, amplifier circuitry such as power amplifier 76, and digital-to-analog converter (DAC) 74. Optical components 68 may include an optical receiver such as optical receiver 72 and optical local oscillator (LO) light sources (emitters) 70. LO light sources 70 may include two or more light sources such as laser light sources, laser diodes, optical phase locked loops, or other optical emitters that emit light (e.g., optical local oscillator signals LO1 and LO2) at respective wavelengths. If desired, LO light sources 70 may include a single light source and may include optical components for splitting the light emitted by the light source into different wavelengths. Signal path 28 may be coupled to optical components 68 over optical path 66. Optical path 66 may include one or more optical fibers and/or waveguides.

Signal path 28 may include an optical splitter such as optical splitter (OS) 54, optical paths such as optical path 64 and optical path 62, an optical combiner such as optical combiner (OC) 52, and optical path 40. Optical path 62 may be an optical fiber or waveguide. Optical path 64 may be an optical fiber or waveguide. Optical splitter 54 may have a first (e.g., input) port coupled to optical path 66, a second (e.g., output) port coupled to optical path 62, and a third (e.g., output) port coupled to optical path 64. Optical path 64 may couple optical splitter 54 to a first (e.g., input) port of optical combiner 52. Optical path 62 may couple optical splitter 54 to a second (e.g., input) port of optical combiner 52. Optical combiner 52 may have a third (e.g., output) port coupled to optical path 40.

An optical phase shifter such as optical phase shifter 80 may be (optically) interposed on or along optical path 64. An optical modulator such as optical modulator 56 may be (optically) interposed on or along optical path 62. Optical modulator 56 may be, for example, a Mach-Zehnder modulator (MZM) and may therefore sometimes be referred to herein as MZM 56. MZM 56 includes a first optical arm (branch) 60 and a second optical arm (branch) 58 interposed in parallel along optical path 62. Propagating optical local oscillator signal LO2 along arms 60 and 58 of MZM 56 may, in the presence of a voltage signal applied to one or both arms, allow different optical phase shifts to be imparted on each arm before recombining the signal at the output of the MZM (e.g., where optical phase modulations produced on the arms are converted to intensity modulations at the output of MZM 56). When the voltage applied to MZM 56 includes wireless data, MZM 56 may modulate the wireless data onto optical local oscillator signal LO2. If desired, the phase shifting performed at MZM 56 may be used to perform beam forming/steering in addition to or instead of optical phase shifter 80. MZM 56 may receive one or more bias voltages $W_{BIAS}$ (sometimes referred to herein as bias signals $W_{BIAS}$) applied to one or both of arms 58 and 60. Control circuitry 14 (FIG. 1) may provide bias voltage $W_{BIAS}$ with different magnitudes to place MZM 56 into different operating modes (e.g., operating modes that suppress optical carrier signals, operating modes that do not suppress optical carrier signals, etc.).

Intermediate frequency signal path 44 may couple UTC PD 42 to MZM 56 (e.g., arm 60). An amplifier such as low noise amplifier 82 may be interposed on intermediate frequency signal path 44. Intermediate frequency signal path 44 may be used to pass intermediate frequency signals SIGIF from UTC PD 42 to MZM 56. DAC 74 may have an input coupled to up-conversion circuitry, modulator circuitry, and/or baseband circuitry in a transmitter of transceiver circuitry 26. DAC 74 may receive digital data to transmit over antenna 30 and may convert the digital data to the analog domain (e.g., as data DAT). DAC 74 may have an output coupled to transmit data path 78. Transmit data path 78 may couple DAC 74 to MZM 56 (e.g., arm 60). Each of the components along signal path 28 may allow the same antenna 30 to both transmit THF signals 32 and receive THF signals 34 (e.g., using the same components along signal path 28), thereby minimizing space and resource consumption within device 10.

LO light sources 70 may produce (emit) optical local oscillator signals LO1 and LO2 (e.g., at different wavelengths that are separated by the wavelength of THF signals 32/34). Optical components 68 may include lenses, waveguides, optical couplers, optical fibers, and/or other optical components that direct the emitted optical local oscillator signals LO1 and LO2 towards optical splitter 54 via optical path 66. Optical splitter 54 may split the optical signals on optical path 66 (e.g., by wavelength) to output optical local oscillator signal LO1 onto optical path 64 while outputting optical local oscillator signal LO2 onto optical path 62.

Control circuitry 14 (FIG. 1) may provide phase control signals CTRL to optical phase shifter 80. Phase control signals CTRL may control optical phase shifter 80 to apply optical phase shift S to the optical local oscillator signal LO1 on optical path 64. Phase shift S may be selected to steer a signal beam of THF signals 32/34 in a desired pointing direction. Optical phase shifter 80 may pass the phase-shifted optical local oscillator signal LO1 (denoted as LO1+ S) to optical combiner 52. Signal beam steering is performed in the optical domain (e.g., using optical phase shifter 80) rather than in the THF domain because there are no satisfactory phase shifting circuit components that operate at frequencies as high as the frequencies of THF signals 32 and 34. Optical combiner 52 may receive optical local oscillator signal LO2 over optical path 62. Optical combiner 52 may combine optical local oscillator signals LO1 and LO2 onto optical path 40, which directs the optical local oscillator signals onto UTC PD 42 for use during signal transmission or reception.

During transmission of THF signals 32, DAC 74 may receive digital wireless data (e.g., data packets, frames, symbols, etc.) for transmission over THF signals 32. DAC 74 may convert the digital wireless data to the analog domain and may output (transmit) the data onto transmit data path 78 as data DAT (e.g., for transmission via antenna 30). Power amplifier 76 may amplify data DAT. Transmit data path 78 may pass data DAT to MZM 56 (e.g., arm 60). MZM 56 may modulate data DAT onto optical local oscillator signal LO2 to produce modulated optical local oscillator signal LO2' (e.g., an optical local oscillator signal at the frequency/wavelength of optical local oscillator signal LO2 but that is modulated to include the data identified by data DAT). Optical combiner 52 may combine optical local oscillator signal LO1 with modulated optical local oscillator signal LO2' at optical path 40.

Optical path 40 may illuminate UTC PD 42 with (using) optical local oscillator signal LO1 (e.g., with the phase shift S applied by optical phase shifter 80) and modulated optical local oscillator signal LO2'. Control circuitry 14 (FIG. 1) may apply a control signal $V_{BIAS}$ to UTC PD 42 that configures antenna 30 for the transmission of THF signals 32. UTC PD 42 may convert optical local oscillator signal LO1 and modulated optical local oscillator signal LO2' into antenna currents on antenna resonating element 36 at the frequency of THF signals 32 (e.g., while programmed for transmission using control signal $V_{BIAS}$). The antenna currents on antenna resonating element 36 may radiate THF signals 32. The frequency of THF signals 32 is given by the difference in frequency between optical local oscillator signal LO1 and modulated optical local oscillator signal LO2'. Control signals $V_{BIAS}$ may control UTC PD 42 to preserve the modulation from modulated optical local oscillator signal LO2' in the radiated THF signals 32. External equipment that receives THF signals 32 will thereby be able to extract data DAT from the THF signals 32 transmitted by antenna 30.

During reception of THF signals 34, MZM 56 does not modulate any data onto optical local oscillator signal LO2. Optical path 40 therefore illuminates UTC PD 42 with optical local oscillator signal LO1 (e.g., with phase shift S) and optical local oscillator signal LO2. Control circuitry 14 (FIG. 1) may apply a control signal $V_{BIAS}$ (e.g., a bias voltage) to UTC PD 42 that configures antenna 30 for the receipt of THF signals 32. UTC PD 42 may use optical local oscillator signals LO1 and LO2 to convert the received THF signals 34 into intermediate frequency signals SIGIF output onto intermediate frequency signal path 44 (e.g., while programmed for reception using bias voltage $V_{BIAS}$). Intermediate frequency signals SIGIF may include the modulated data from the received THF signals 34. Low noise amplifier 82 may amplify intermediate frequency signals SIGIF, which are then provided to MZM 56 (e.g., arm 60). MZM 56 may convert intermediate frequency signals SIGIF to the optical domain as optical signals LOrx (e.g., by modulating the data in intermediate frequency signals SIGIF onto one of the optical local oscillator signals) and may pass the optical signals to optical receiver 72 in optical components 68, as shown by arrow 63 (e.g., via optical paths 62 and 66 or other optical paths). Control circuitry 14 (FIG. 1) may use optical receiver 72 to convert optical signals LOrx to other formats and to recover (demodulate) the data carried by THF signals 34 from the optical signals. In this way, the same antenna 30 and signal path 28 may be used for both the transmission and reception of THF signals while also performing beam steering operations.

The example of FIG. 6 in which intermediate frequency signals SIGIF are converted to the optical domain is merely illustrative. If desired, transceiver circuitry 26 may receive and demodulate intermediate frequency signals SIGIF without first passing the signals to the optical domain. For example, transceiver circuitry 26 may include an analog-to-digital converter (ADC), intermediate frequency signal path 44 may be coupled to an input of the ADC rather than to MZM 56, and the ADC may convert intermediate frequency signals SIGIF to the digital domain. As another example, intermediate frequency signal path 44 may be omitted and control signals $V_{BIAS}$ may control UTC PD 42 to directly sample THF signals 34 with optical local oscillator signals LO1 and LO2 to the optical domain. As an example, UTC PD 42 may use the received THF signals 34 and control signals $V_{BIAS}$ to produce an optical signal on optical path 40. The optical signal may have an optical carrier with sidebands that are separated from the optical carrier by a fixed frequency offset (e.g., 30-100 GHz, 60 GHz, 50-70 GHz, 10-100 GHz, etc.). The sidebands may be used to carry the modulated data from the received THF signals 34. Signal path 28 may direct (propagate) the optical signal produced by UTC PD 42 to optical receiver 72 in optical components 68 (e.g., via optical paths 40, 64, 62, 66, 63, and/or other optical paths). Control circuitry 14 (FIG. 1) may use optical receiver 72 to convert the optical signal to other formats and to recover (demodulate) the data carried by THF signals 34 from the optical signal (e.g., from the sidebands of the optical signal). If desired, antenna 30 may be integrated into an access point 45.

Figure 7:
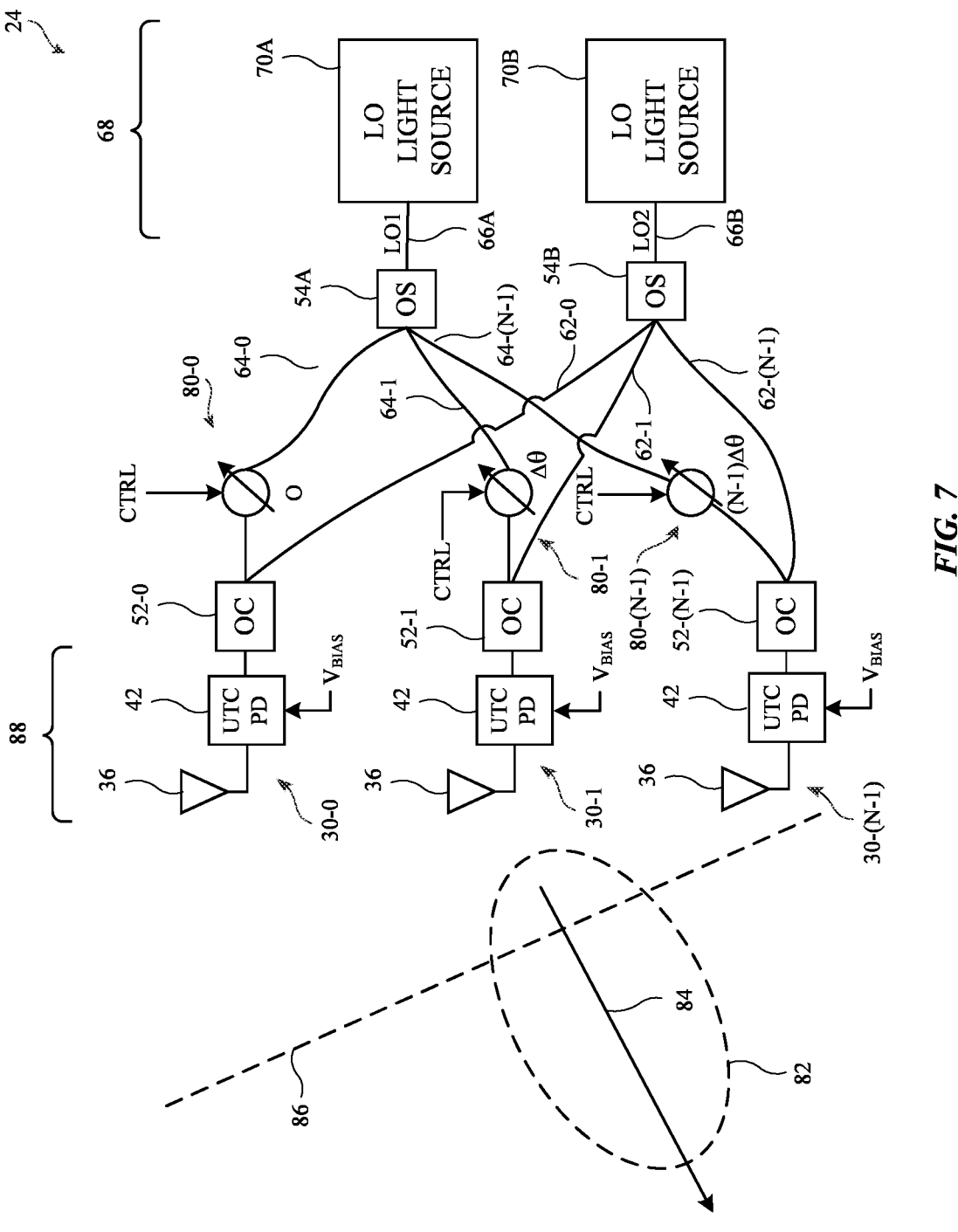
FIG. 7 is a circuit diagram of an illustrative phased antenna array that conveys wireless signals at frequencies greater than about 100 GHz within a corresponding signal beam in accordance with some embodiments.

FIG. 7 is a circuit diagram showing one example of how multiple antennas 30 may be integrated into a phased antenna array 88 that conveys THF signals over a corresponding signal beam. In the example of FIG. 7, MZMs 56, intermediate frequency signal paths 44, data paths 78, and optical receiver 72 of FIG. 6 have been omitted for the sake of clarity. Each of the antennas in phased antenna array 88 may alternatively sample received THF signals directly into the optical domain or may pass intermediate frequency signals SIGIF to ADCs in transceiver circuitry 26.

As shown in FIG. 7, phased antenna array 88 includes N antennas 30 such as a first antenna 30-0, a second antenna 30-1, an Nth antenna 30-(N−1), etc. Each of the antennas 30 in phased antenna array 88 may be coupled to optical components 68 via a respective optical signal path (e.g., optical signal path 28 of FIG. 6). Each of the N signal paths may include a respective optical combiner 52 coupled to the UTC PD 42 of the corresponding antenna 30 (e.g., the UTC PD 42 in antenna 30-0 may be coupled to optical combiner 52-0, the UTC PD 42 in antenna 30-1 may be coupled to optical combiner 52-1, the UTC PD 42 in antenna 30-(N−1) may be coupled to optical combiner 52-(N−1), etc.). Each of the N signal paths may also include a respective optical path 62 and a respective optical path 64 coupled to the corresponding optical combiner 52 (e.g., optical paths 64-0 and 62-0 may be coupled to optical combiner 52-0, optical paths 64-1 and 62-1 may be coupled to optical combiner 52-1, optical paths 64-(N−1) and 62-(N−1) may be coupled to optical combiner 52-(N−1), etc.).

Optical components 68 may include LO light sources 70 such as a first LO light source 70A and a second LO light source 70B. The optical signal paths for each of the antennas 30 in phased antenna array 88 may share one or more optical splitters 54 such as a first optical splitter 54A and a second optical splitter 54B. LO light source 70A may generate (e.g., produce, emit, transmit, etc.) first optical local oscillator signal LO1 and may provide first optical local oscillator signal LO1 to optical splitter 54A via optical path 66A. Optical splitter 54A may distribute first optical local oscillator signal LO1 to each of the UTC PDs 42 in phased antenna array 88 over optical paths 64 (e.g., optical paths 64-0, 64-1, 64-(N−1), etc.). Similarly, LO light source 70B may generate (e.g., produce, emit, transmit, etc.) second optical local oscillator signal LO2 and may provide second optical local oscillator signal LO2 to optical splitter 54B via optical path 66B. Optical splitter 54B may distribute second optical local oscillator signal LO2 to each of the UTC PDs 42 in phased antenna array 88 over optical paths 62 (e.g., optical paths 62-0, 62-1, 62-(N−1), etc.).

A respective optical phase shifter 80 may be interposed along (on) each optical path 64 (e.g., a first optical phase shifter 80-0 may be interposed along optical path 64-0, a second optical phase shifter 80-1 may be interposed along optical path 64-1, an Nth optical phase shifter 80-(N−1) may be interposed along optical path 64-(N−1), etc.). Each optical phase shifter 80 may receive a control signal CTRL that controls the phase S provided to optical local oscillator signal LO1 by that optical phase shifter (e.g., first optical phase shifter 80-0 may impart an optical phase shift of zero degrees/radians to the optical local oscillator signal LO1 provided to antenna 30-0, second optical phase shifter 80-1 may impart an optical phase shift of $\Delta\phi$ to the optical local oscillator signal LO1 provided to antenna 30-1, Nth optical phase shifter 80-(N−1) may impart an optical phase shift of $(N−1)\Delta\phi$ to the optical local oscillator signal LO1 provided to antenna 30-(N−1), etc.). By adjusting the phase S imparted by each of the N optical phase shifters 80, control circuitry 14 (FIG. 1) may control each of the antennas 30 in phased antenna array 88 to transmit THF signals 32 and/or to receive THF signals 34 within a formed signal beam 83. Signal beam 83 may be oriented in a particular beam pointing direction (angle) 84 (e.g., the direction of peak gain of signal beam 83). The THF signals conveyed by phased antenna array 88 may have wavefronts 86 that are orthogonal to beam pointing direction 84. Control circuitry 14 may adjust beam pointing direction 84 over time to point towards external communications equipment or an external object or to point away from external objects, as examples.

While communications at frequencies greater than about 100 GHz allow for extremely high data rates (e.g., greater than 100 Gbps), it can be difficult to provide THz devices capable of delivering the required output power for communications at these frequencies (the so-called "THz gap"). For example, electronics-based devices are limited by parasitic circuit elements such as series resistances and shunt capacitances, as well as the fundamental limitation of the finite velocity of electrons in crystal. The THz gap problem can be addressed by generating THF signals for transmission using beats between optical local oscillator signals LO1 and LO2 (e.g., as described above in connection with FIGS. 2-7) due to the fact that optical devices (e.g., lasers, semiconductor optical amplifiers, etc.) have much higher efficiencies.

Figure 8:
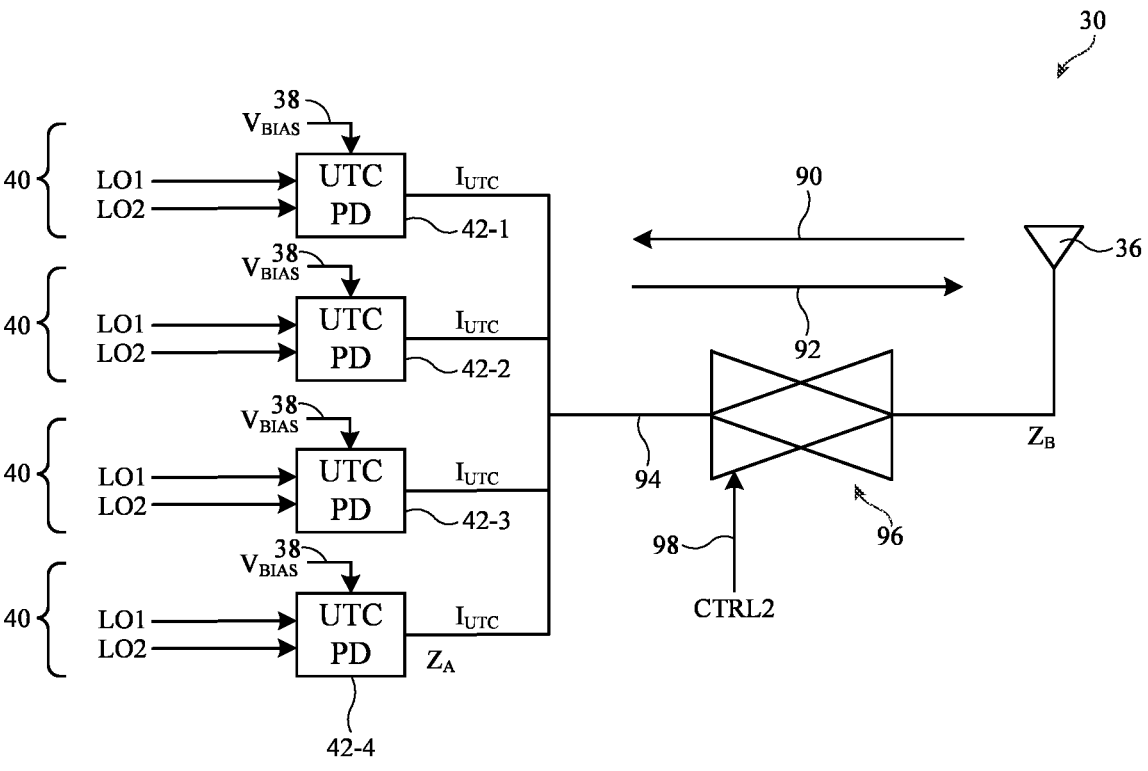
FIG. 8 is a circuit diagram of an illustrative antenna having multiple photodiodes and a common gate amplifier for boosting the power of wireless signals at frequencies greater than about 100 GHz in accordance with some embodiments.

In practice, thermal dissipation may limit UTC PD 42 and the overall power produced at antenna 30. It may therefore be desirable to be able to boost the power produced at antenna 30, thereby allowing for optimal communications using THF signals 34 and 32. FIG. 8 is a circuit block diagram showing one example of how antenna 30 may boost the power of THF signals 34 and 32.

As shown in FIG. 8, antenna 30 may include multiple UTC PDs 42 such as UTC PDs 42-1, 42-2, 42-3, and 42-4. This example is merely illustrative and, in general, antenna 30 may include any desired number of two or more UTC PDs 42 (e.g., two UTC PDs 42, three UTC PDs 42, more than four UTC PDs 42, etc.). Each UTC PD 42 may receive optical local oscillator signals LO1 and LO2 over optical path 40 (e.g., UTC PDs 42-1, 42-2, 42-3, and 42-4 may be coupled in parallel between optical path 40 and antenna resonating element 36 and may each be illuminated by the same optical local oscillator signal LO1 and the same optical local oscillator signal LO2). Optical local oscillator signal LO1 may include a phase shift S (e.g., as produced by optical phase shifter 80 of FIG. 6) and/or optical local oscillator signal LO2 may be modulated with wireless data (e.g., optical local oscillator signal LO2 of FIG. 8 may be modulated optical local oscillator signal LO2' of FIG. 6). Each UTC PD 42 may be controlled by the same control signal V$_{BIAS}$. Each UTC PD 42 may have an output terminal communicably coupled to antenna resonating element 36 over signal path 94. An amplifier such as common gate amplifier (CGA) 96 may be disposed on signal path 94 and interposed between UTC PDs 42 and antenna resonating element 36.

Implementing antenna 30 using multiple UTC PDs 42 that are illuminated using the same optical local oscillator signals LO1 and LO2 may serve to boost the power of antenna 30. For example, each UTC PD 42 may generate the same antenna current I$_{UTC}$ on signal path 94 in response to optical local oscillator signals LO1 and LO2. This may produce an overall antenna current on signal path 94 that is equal to 4*I$_{UTC}$, which is four times greater than the antenna current on signal path 94 when antenna 30 includes only a single UTC PD 42. In general, the greater the number of UTC PDs 42 in antenna 30 the greater the overall antenna current on signal path 94. As the power on signal path 94 is proportional to the square of antenna current I$_{UTC}$, the overall antenna current on signal path 94 may exhibit 16 times more power than in implementations where antenna 30 includes only a single UTC PD 42 (e.g., adding additional UTC PDs 42 to antenna 30 may serve to boost the power of antenna 30).

When disposed in this way, the UTC PDs 42 in antenna 30 are coupled to CGA 96 in a current sharing configuration. CGA 96 may perform amplification on the antenna currents flowing along signal path 94 to further boost the power of antenna 30. Consider an example in which a single UTC PD 42 provides a –5 dBm signal (e.g., at 300 GHz) and CGA 96 provides about 3 dB of amplification. In this example, four UTC PDs (e.g., UTC PDs 42-1, 42-2, 42-3, and 42-4) may collectively provide 16 times more power (or 12 dB) and CGA 96 may contribute around 3 dB to produce+10 dBm total output power for antenna 30. This boost in output power may serve to mitigate the thermal dissipation limitation of UTC PDs and may allow for optimal wireless communications using antenna 30.

At the same time, the circuit components of CGA 96 may help to match the output impedance Z$_A$ of UTC PDs 42 with the input impedance Z$_B$ of antenna resonating element 36 for the antenna currents on signal path 94 (e.g., without requiring additional costly matching circuitry). In addition, CGA 96 may serve to isolate the output of UTC PDs 42 from antenna impedance mismatches that may occur when antenna resonating element 36 is subject to impedance loading from the presence of nearby external objects, helping antenna 30 to exhibit maximum antenna efficiency over a wide range of operating conditions. CGA 96 may exhibit significantly higher frequency bandwidth and improved signal isolation than in implementations where a common emitter amplifier is disposed on signal path 94.

CGA 96 may be a uni-directional amplifier in examples where antenna 30 is used only to transmit or only to receive THF signals. CGA 96 may also be a bi-directional amplifier that is operable in both transmit and receive modes. When CGA 96 is a bi-directional amplifier, CGA 96 may receive a control signal CTRL2 at control input 98. Control signal CTRL2 may control (switch) CGA 96 between a transmit mode and a receive mode.

During signal transmission, optical local oscillator signal LO2 may include modulated optical local oscillator signal LO2' (FIG. 6). Control signal V$_{BIAS}$ may configure (place) UTC PDs 42-1, 42-2, 42-3, and 42-4 in a signal transmission mode (e.g., as shown in FIG. 2). Similarly, control signal CTRL2 may configure (place) CGA 96 in the signal transmission mode. In the signal transmission mode, UTC PDs 42 may each generate a respective antenna current I$_{UTC}$ based on the beats between optical local oscillator signal LO1 and modulated optical local oscillator signal LO2'. The frequency of antenna current I$_{UTC}$ may be given by the difference between the frequencies of optical local oscillator signals LO1 and LO2 (e.g., antenna current I$_{UTC}$ may be at a frequency greater than or equal to about 100 THz). Antenna current I$_{UTC}$ may preserve (carry) the wireless data associated with the modulation to optical local oscillator signal LO2. Control signal CTRL2 configures CGA 96 to form a power amplifier (PA) that amplifies the overall antenna current 4*I$_{UTC}$ produced by the UTC PDs 42 in the transmit direction (as shown by arrow 92). Antenna resonating element 36 may transmit corresponding THF signals 32 (FIG. 6) as amplified by CGA 96.

During signal reception, control signal V$_{BIAS}$ may configure (place) UTC PDs 42-1, 42-2, 42-3, and 42-4 in a signal reception mode (e.g., as shown in FIG. 3). Similarly, control signal CTRL2 may configure (place) CGA 96 in the signal reception mode. In the signal reception mode, antenna resonating element 36 may produce antenna currents on signal path 94 from received THF signals 34 (FIG. 6). Control signal CTRL2 configures CGA 96 to form a low noise amplifier (LNA) that amplifies the antenna currents in the receive direction (as shown by arrow 90). UTC PDs 42 may convert the antenna currents into intermediate frequency signals or optical signals (e.g., as shown in FIG. 6). In this way, antenna 30 may exhibit boosted power and may be used for both signal transmission and reception, while also exhibiting optimal impedance matching between the UTC PDs and the antenna resonating element arms.

If desired, CGA 96 may be implemented using an indium phosphide (InP) process technology (e.g., CGA 96 may be an InP common gate amplifier). In these examples, UTC PDs 42 may also be implemented using the InP process technology (e.g., UTC PDs 42 may also be InP UTC PDs). In these examples, UTC PDs 42 may be integrated within CGA 96 if desired. This is merely illustrative and, in general, CGA 96 may be implemented using any desired process technology. The example of FIG. 8 is merely illustrative. UTC PDs 42 may each receive optical local oscillator signals LO1 and LO2 over the same optical path 40 or two or more different (e.g., respective) optical paths. Antenna 30 may include any desired number of two or more UTC PDs 42. If desired, more than one CGA may be disposed on signal path 94.

Figure 9:
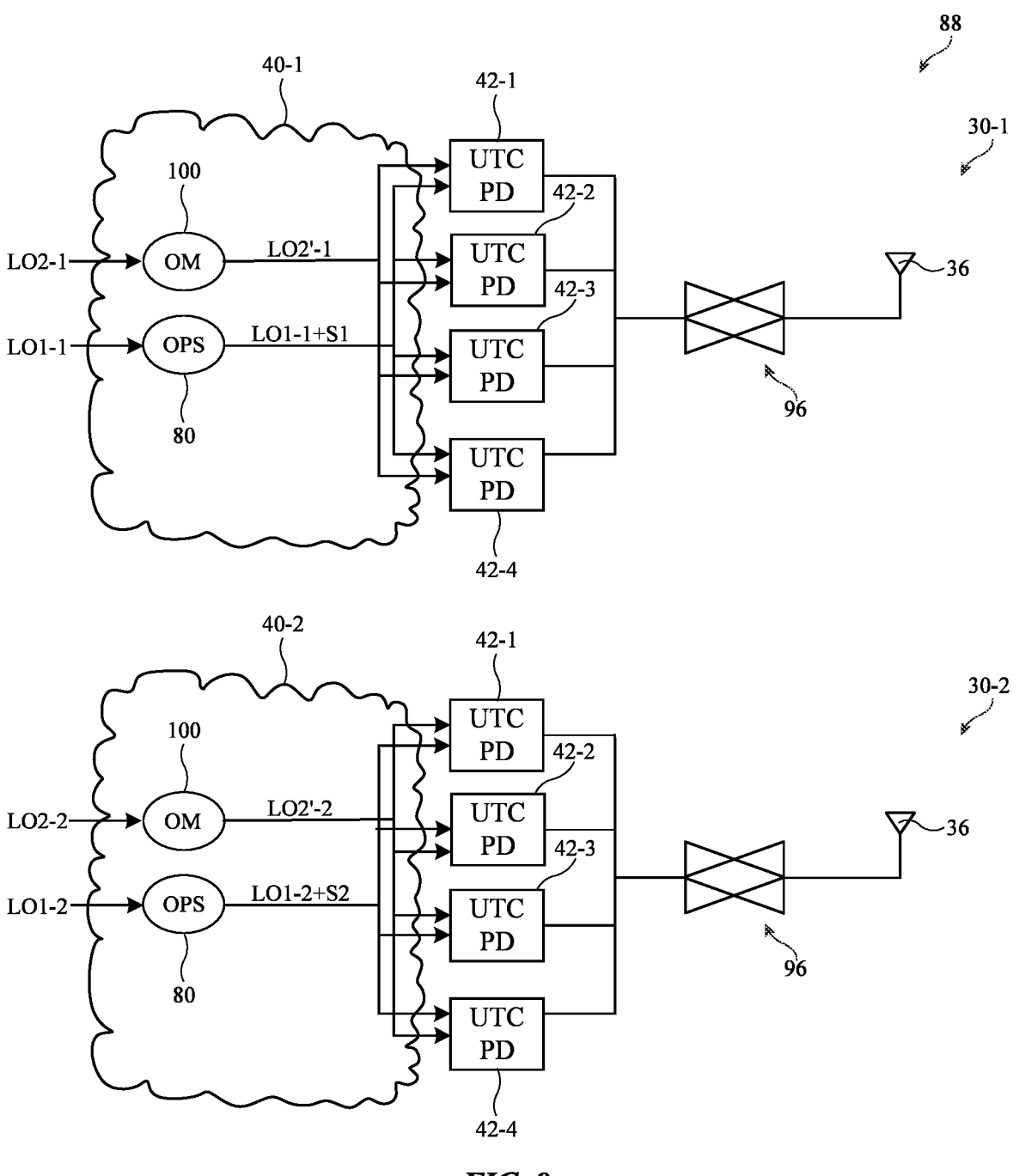
FIG. 9 is a circuit diagram of an illustrative phased antenna array having antennas each with a respective set of photodiodes and a respective common gate amplifier for conveying wireless signals at frequencies greater than about 100 GHz in accordance with some embodiments.

To further boost the power of the THF signals, antenna 30 may be integrated into phased antenna array 88 (FIG. 7). FIG. 9 is a diagram showing one example of how phased antenna array 88 may include power-boosted antennas 30 such as the antenna 30 of FIG. 8. As shown in FIG. 9, phased antenna array 88 may include at least a first antenna 30-1 and a second antenna 30-2. Each antenna may include a respective set of two or more UTC PDs 42 (e.g., four UTC PDs 42-1, 42-2, 42-3, and 42-4) coupled to its respective antenna resonating element 36 through a respective CGA 96. Each antenna 30 in phased antenna array 88 may be fed using a respective optical path 40 (e.g., antenna 30-1 may be fed using optical path 40-1, antenna 30-2 may be fed using optical path 40-2, etc.). Each optical path 40 may include respective optical fibers, waveguides, optical combiners, lenses, and/or optical splitters or two or more of the optical paths 40 may share the same optical fibers, waveguides, optical combiners, lenses, and/or optical splitters.

Each optical path 40 may include a respective optical modulator 100 as shown in the illustrative example of FIG. 9 or, if desired, two or more (e.g., each) optical path 40 may share the same optical modulator 100 (e.g., MZM 60 of FIG. 6). Each optical modulator 100 may receive a respective optical local oscillator signal LO2 as shown in the illustrative example of FIG. 9 (e.g., antenna 30-1 may receive optical local oscillator signal LO2-1, antenna 30-2 may receive optical local oscillator signal LO2-2, etc.) or, if desired, each optical path 40 may receive the same optical local oscillator signal LO2 (e.g., optical local oscillator signal LO2-2 of FIG. 9 may be the same as optical local oscillator signal LO2-1). Optical modulator(s) 100 may generate modulated optical local oscillator signals LO2' based on optical local oscillator signals LO2 (e.g., modulated optical local oscillator signal LO2'-1 for antenna 30-1, modulated optical local oscillator signal LO2'-2 for antenna 30-2 which may be the same as modulated optical local oscillator signal LO2'-1 or which may be different from modulated optical local oscillator signal LO2'-1, etc.).

Each optical path 40 and thus each antenna 30 in phased antenna array 88 may include a respective optical phase shifter (OPS) 80. Each optical phase shifter 80 may receive a respective optical local oscillator signal LO1 as shown in the illustrative example of FIG. 9 (e.g., antenna 30-1 may receive optical local oscillator signal LO1-1, antenna 30-2 may receive optical local oscillator signal LO1-2, etc.) or, if desired, each optical path 40 may receive the same optical local oscillator signal LO1 (e.g., optical local oscillator signal LO1-2 of FIG. 9 may be the same as optical local oscillator signal LO1-1). Each optical phase shifter 80 may impart a respective phase shift S onto its optical local oscillator signal LO1 (e.g., the optical phase shifter 80 in antenna 30-1 may impart a first phase shift 51 to optical local oscillator signal LO1-1, the optical phase shifter 80 in antenna 30-2 may impart a second phase shift S2 to optical local oscillator signal LO1-2 which may be the same as optical local oscillator signal LO1-1 or which may be different from optical local oscillator signal LO1-1, etc.). In other words, each UTC PD 42 in each antenna 30 may be provided with an optical local oscillator signal LO1 that is provided with the same phase shift S (e.g., where S varies across the antennas 30 in phased antenna array 88). This may configure the antennas 30 in phased antenna array 88 to collectively form a signal beam in a selected beam pointing direction. The phases S may be varied over time to steer the beam in other beam pointing directions.

When each antenna is provided with the same modulated data (e.g., the same modulated optical local oscillator LO2' by an optical modulator 100 shared across the antennas 30), the UTC PDs 42 and CGA 96 in each antenna 30 may optimally boost the power of the signals conveyed by the corresponding antenna 30, while the power is further boosted by constructive contributions from each respective antenna 30 in phased antenna array 88 conveying the signals, and while the phase shifts S that are varied across phased antenna array 88 to steer the corresponding beam of THF signals in a desired beam pointing direction. In general, increasing the number of antennas 30 in phased antenna array 88 that are conveying the modulated data may further serve to boost the power with which the signals and thus the modulated data are conveyed. The overall generated output power may be more than sufficient for short range (e.g., 10-100 m) communications at THz frequencies, for example.

Figure 10:
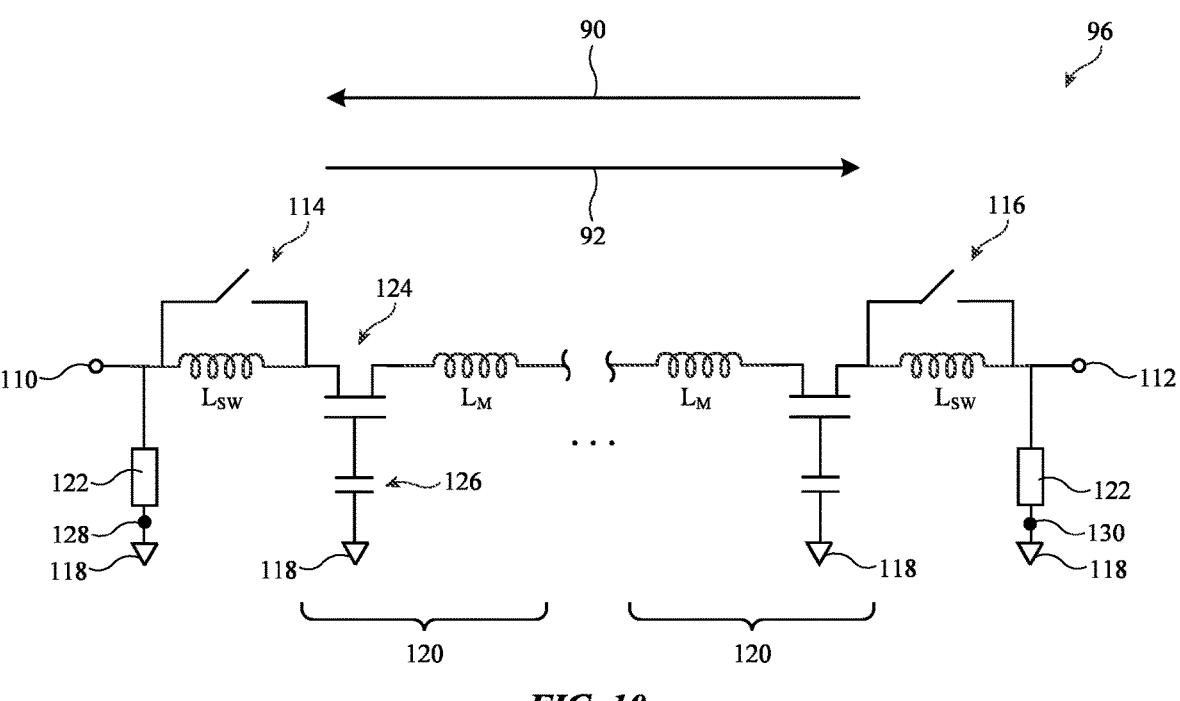
FIG. 10 is a flow chart of illustrative operations involved in transmitting and receiving signals at frequencies greater than about 100 GHz using antennas of the types shown in FIGS. 8 and 9 in accordance with some embodiments.

FIG. 10 is a circuit diagram of an illustrative CGA 96 that may be used to boost the power of antenna 30. As shown in FIG. 10, CGA 96 may have an input terminal 110 and an output terminal 112. Input terminal 110 may be coupled to the UTC PDs 42 in the corresponding antenna 30 (FIG. 8). Output terminal 112 may be coupled to the antenna resonating element 36 in the corresponding antenna 30.

CGA 96 may have a first choke 122 that couples input terminal 110 to ground 118. CGA 96 may have a second choke 122 that couples output terminal 112 to ground 118. CGA 96 may include a set of one or more CGA stages 120 coupled in series between input terminal 110 and output terminal 112. A first switch 114 may be coupled in parallel with a first inductor $L_{SW}$ between input terminal 110 and the first CGA stage 120 in CGA 96. A second switch 116 may be coupled in parallel with a second inductor $L_{SW}$ between output terminal 112 and the last CGA stage 120 in CGA 96. Each CGA stage 120 may include a transistor 124 having a first source/drain terminal coupled to the previous CGA stage 120 (or switch 114 for the first CGA stage 120) and having a second source/drain terminal coupled to a corresponding CGA stage inductor LM. The CGA stage inductor LM may be coupled between the second source/drain terminal of the transistor 124 in its CGA stage 120 and the first source/drain terminal of the transistor 124 in the next CGA stage 120 (or switch 116 for the last CGA stage 120). The gate terminal of transistor 124 may be coupled to ground 118 through a corresponding capacitance 126 (e.g., each transistor 124 in CGA 96 has a common gate held at the same (ground) potential).

Control signals CTRL2 (FIG. 8) may control the state of switches 114 and 116 to switch CGA 96 between the transmit and receive modes. In the transmit mode, switch 114 is closed (e.g., turned on or activated to form a short circuit impedance around the parallel-coupled inductor $L_{SW}$), switch 116 is open (e.g., turned off or deactivated to form an open circuit impedance around the parallel-coupled inductor $L_{SW}$), and a bias voltage $V_{DD}$ is applied at node 130 between the choke 122 at output terminal 112 and ground 118. This may configure antenna current to flow in the direction of arrow 92 while CGA stages 120 amplify the antenna currents as a power amplifier and maintains a wide bandwidth characteristic. In the receive mode, switch 114 is open, switch 116 is closed, and the bias voltage $V_{DD}$ is applied at node 128 between the choke 122 at input terminal 112 and ground 118. This may configure antenna current to flow in the direction of arrow 90 while CGA stages 120 amplify the antenna currents as a low noise amplifier and maintain a wide bandwidth characteristic. At the same time, the components of CGA 96 may serve to match the impedance $Z_A$ of UTC PDs 42 to the impedance $Z_B$ antenna resonating element 36 (FIG. 8) while helping to isolate against antenna mismatch due to impedance loading variations. The example of FIG. 10 is merely illustrative and, in general, other architectures may be used for CGA 96.

FIG. 11 is a flow chart of illustrative operations that may be involved in communicating using antenna 30 (FIGS. 8 and 9) with boosted power. At operation 130, control circuitry 14 (FIG. 1) may use control signals $V_{BIAS}$ to configure each of the UTC PDs 42 in antenna 30 for signal transmission (e.g., by placing the UTC PDs in the transmit mode).

At operation 132, control circuitry 14 (FIG. 1) may use control signals CTRL2 to configure CGA 96 in antenna 30 for signal transmission (e.g., by placing the CGA in the transmit mode). Operations 130 and 132 may be performed concurrently if desired.

At operation 134, transceiver circuitry 26 may transmit THF signals using antenna 30. For example, the same optical local oscillator signal LO1 (e.g., with a phase shift S) and the same modulated optical local oscillator signal LO2' may be provided to each of the UTC PDs 42 in antenna 30. The UTC PDs 42 may each generate a respective antenna current $I_{UTC}$ based on optical local oscillator signal LO1 and modulated optical local oscillator signal LO2'. CGA 96 may amplify the antenna currents as a power amplifier. Antenna resonating element 36 may transmit THF signals 32 corresponding to the amplified currents.

At operation 136, control circuitry 14 (FIG. 1) may use control signals $V_{BIAS}$ to configure each of the UTC PDs 42 in antenna 30 for signal reception (e.g., by placing the UTC PDs in the receive mode).

At operation 138, control circuitry 14 (FIG. 1) may use control signals CTRL2 to configure CGA 96 in antenna 30 for signal reception (e.g., by placing the CGA in the receive mode). Operations 136 and 138 may be performed concurrently if desired.

At operation 140, transceiver circuitry 26 may receive THF signals 34 using antenna 30, producing corresponding antenna currents. CGA 96 may amplify the antenna currents as a low noise amplifier. UTC PDs 42 may convert the antenna currents into intermediate frequency signals or optical signals. Processing may loop back to operation 130 via path 142 (e.g., antenna 30 may transmit and receive THF signals using a time division duplex scheme).

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users. The optical components described herein (e.g., MZM modulator(s), waveguide(s), phase shifter(s), UTC PD(s), etc.) may be implemented in plasmonics technology if desired.

The methods and operations described above in connection with FIGS. 1-11 (e.g., the operations of FIG. 11) may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. An electronic device comprising:
   an antenna resonating element;
   a photodiode coupled to the antenna resonating element via a signal path, the photodiode being configured to receive a first optical local oscillator (LO) signal and a second optical LO signal at a different frequency than the first optical LO signal; and
   a common gate amplifier disposed on the signal path between the photodiode and the antenna resonating element, wherein the common gate amplifier is configured to match an output impedance of the photodiode to an input impedance of the antenna resonating element.

2. The electronic device of claim 1, wherein the common gate amplifier is bi-directional.

3. The electronic device of claim 2, wherein the common gate amplifier comprises:
   a first terminal communicatively coupled to the photodiode;
   a second terminal communicatively coupled to the antenna resonating element;
   one or more common gate amplifier stages coupled in series between the first terminal and the second terminal;
   a first switch coupled between the one or more common gate amplifier stages and the first terminal; and
   a second switch coupled between the one or more common gate amplifier stages and the second terminal.

4. The electronic device of claim 3, wherein the common gate amplifier is operable in a transmit mode in which current on the signal path passes from the first terminal to the second terminal and is operable in a receive mode in which current on the signal path passes from the second terminal to the first terminal, the first switch being closed and the second switch being open when the common gate amplifier is in the transmit mode, and the first switch being open and the second switch being closed when the common gate amplifier is in the receive mode.

5. The electronic device of claim 1, wherein the common gate amplifier comprises an indium phosphide (InP) common gate amplifier.

6. The electronic device of claim 5, wherein the photodiode comprises an InP photodiode integrated within the InP common gate amplifier.

7. The electronic device of claim 1, further comprising:
   an additional photodiode configured to receive the first optical LO signal and the second optical LO signal, wherein the photodiode is configured to generate a first current on the signal path based on the first optical LO signal and the second optical LO signal, the additional photodiode is configured to generate a second current on the signal path based on the first optical LO signal and the second optical LO signal, and the second current is equal to the first current.

8. The electronic device of claim 7, further comprising:

an optical phase shifter configured to apply a phase shift to the first optical LO signal provided to the photodiode and to the first optical LO signal provided to the additional photodiode.

9. The electronic device of claim 1, wherein the photodiode comprises a uni-traveling-carrier photodiode (UTC-PD).

10. The electronic device of claim 1, wherein the common gate amplifier comprises switches that have a first state while the common gate amplifier is in a transmit mode and that have a second state while the common gate amplifier is in a receive mode.

11. An electronic device comprising:

a set of photodiodes;

an antenna resonating element; and a common gate amplifier coupled between the antenna resonating element and the set of photodiodes, wherein the set of photodiodes are coupled to the common gate amplifier in parallel, the common gate amplifier is switchable between a transmit mode and a receive mode, and the common gate amplifier is configured to amplify a first current produced by the set of photodiodes for transmission using the antenna resonating element when in the transmit mode, and amplify a second current produced by the antenna resonating element for reception using the set of photodiodes when in the receive mode, the common gate amplifier including a set of common gate amplifier stages coupled in series between a first terminal and a second terminal, the first terminal being communicatively coupled to the set of photodiodes and the second terminal being communicably coupled to the antenna resonating element;

a first switch that couples the set of common gate amplifier stages to the first terminal, and a second switch that couples the set of common gate amplifier stages to the second terminal, wherein the first switch is closed and the second switch is open in the transmit mode and the first switch is open and the second switch is closed in the receive mode.

12. The electronic device of claim 11, wherein the common gate amplifier is configured to match an impedance of the set of photodiodes to an impedance of the antenna resonating element.

13. The electronic device of claim 11, wherein each photodiode in the set of photodiodes is configured to generate a respective portion of the first current based on a first optical local oscillator (LO) signal and a second optical LO signal.

14. The electronic device of claim 13, wherein the set of photodiodes comprises:

a first photodiode configured to generate a first portion of the first current based on the first optical LO signal and the second optical LO signal; and a second photodiode configured to generate a second portion of the first current based on the first optical LO signal and the second optical LO signal, the second portion being equal to the first portion.

15. The electronic device of claim 14, wherein the set of photodiodes further comprises:

a third photodiode configured to generate a third portion of the first current based on the first optical LO signal and the second optical LO signal, the third portion being equal to the second portion; and a fourth photodiode configured to generate a fourth portion of the first current based on the first optical LO signal and the second optical LO signal, the fourth portion being equal to the third portion.

16. The electronic device of claim 14, further comprising:

an optical modulator configured to modulate wireless data onto the second optical LO signal; and an optical phase shifter configured to apply a phase shift to the first optical LO signal.

17. An electronic device comprising:

a phased antenna array having at least a first antenna resonating element and a second antenna resonating element;

a first photodiode configured to generate a first portion of a first antenna current based on a first optical local oscillator (LO) signal provided with a first phase shift and based on a second optical LO signal modulated with wireless data;

a second photodiode configured to generate a second portion of the first antenna current based on the first optical LO signal provided with the first phase shift and based on the second optical LO signal modulated with the wireless data;

a first amplifier configured to amplify the first antenna current, the first antenna resonating element being configured to transmit first wireless signals corresponding to the first antenna current amplified by the first amplifier;

a third photodiode configured to generate a first portion of a second antenna current based on the first optical LO signal provided with a second phase shift different from the first phase shift and based on the second optical LO signal modulated with the wireless data; and a second amplifier configured to amplify the second antenna current, the second antenna resonating element being configured to transmit second wireless signals corresponding to the second antenna current amplified by the second amplifier.

18. The electronic device of claim 17, further comprising:

a fourth photodiode configured to generate a second portion of the second antenna current based on the first optical LO signal provided with the second phase shift and based on the second optical LO signal modulated with the wireless data.

19. The electronic device of claim 17, further comprising:

a fifth photodiode configured to generate a third portion of the first antenna current based on the first optical LO signal provided with the first phase shift and based on the second optical LO signal modulated with the wireless data;

a sixth photodiode configured to generate a fourth portion of the first antenna current based on the first optical LO signal provided with the first phase shift and based on the second optical LO signal modulated with the wireless data;

a seventh photodiode configured to generate a third portion of the second antenna current based on the first optical LO signal provided with the second phase shift and based on the second optical LO signal modulated with the wireless data; and an eighth photodiode configured to generate a fourth portion of the second antenna current based on the first optical LO signal provided with the second phase shift and based on the second optical LO signal modulated with the wireless data.

* * * * *